US011367372B2

(12) United States Patent
Park et al.

(10) Patent No.: US 11,367,372 B2
(45) Date of Patent: Jun. 21, 2022

(54) DISPLAY DEVICE AND METHOD OF CALIBRATING DRIVING TIME OF BOOST CIRCUIT

(71) Applicant: Anapass Inc., Seoul (KR)

(72) Inventors: Joon Bae Park, Seoul (KR); Jun Young Jang, Seoul (KR); Hyun Seung Lee, Seoul (KR); Dong Joon Lee, Seoul (KR)

(73) Assignee: Anapass Inc., Seoul (KR)

( * ) Notice: Subject to any disclaimer, the term of this patent is extended or adjusted under 35 U.S.C. 154(b) by 0 days.

(21) Appl. No.: 17/167,499

(22) Filed: Feb. 4, 2021

(65) Prior Publication Data
US 2021/0304652 A1 Sep. 30, 2021

(30) Foreign Application Priority Data

Mar. 31, 2020 (KR) ........................ 10-2020-0038874

(51) Int. Cl.
*G09G 3/20* (2006.01)
*H03F 3/45* (2006.01)
*H03K 5/24* (2006.01)

(52) U.S. Cl.
CPC .......... *G09G 3/20* (2013.01); *G09G 2310/08* (2013.01); *G09G 2320/0693* (2013.01); *H03F 3/45475* (2013.01); *H03K 5/24* (2013.01)

(58) Field of Classification Search
CPC ..... G09G 2330/028; G09G 2320/0233; G09G 2320/0693; G09G 2300/0861; H02M 1/0025; H04N 5/37457; H04N 5/3559
See application file for complete search history.

(56) References Cited

U.S. PATENT DOCUMENTS

2014/0368415 A1* 12/2014 Kim ..................... G09G 3/3233
                                                                                  345/77
2017/0236468 A1* 8/2017 Wang .................... H02M 3/158
                                                                                  345/212

FOREIGN PATENT DOCUMENTS

| JP | 2008-145681 A | 6/2008 |
| KR | 10-2009-0080357 A | 7/2009 |
| KR | 10-2014-0109697 | 9/2014 |
| KR | 10-2018-0103073 A | 9/2018 |
| KR | 10-2020-0020069 A | 2/2020 |

OTHER PUBLICATIONS

Korean Office Action for related KR Application No. 10-2020-0097441 dated May 31, 2021 from Korean Intellectual Property Office.

* cited by examiner

*Primary Examiner* — Gerald Johnson
(74) *Attorney, Agent, or Firm* — Paratus Law Group, PLLC

(57) ABSTRACT

A method of calibrating a boost circuit includes: resetting a load to a reference voltage; supplying a charging voltage to the load through a boost circuit for a driving time such that charge sharing is performed in the load; comparing a voltage of the load after the charge sharing with a target voltage; and adjusting a duration of the driving time according to a result of the comparing.

12 Claims, 18 Drawing Sheets

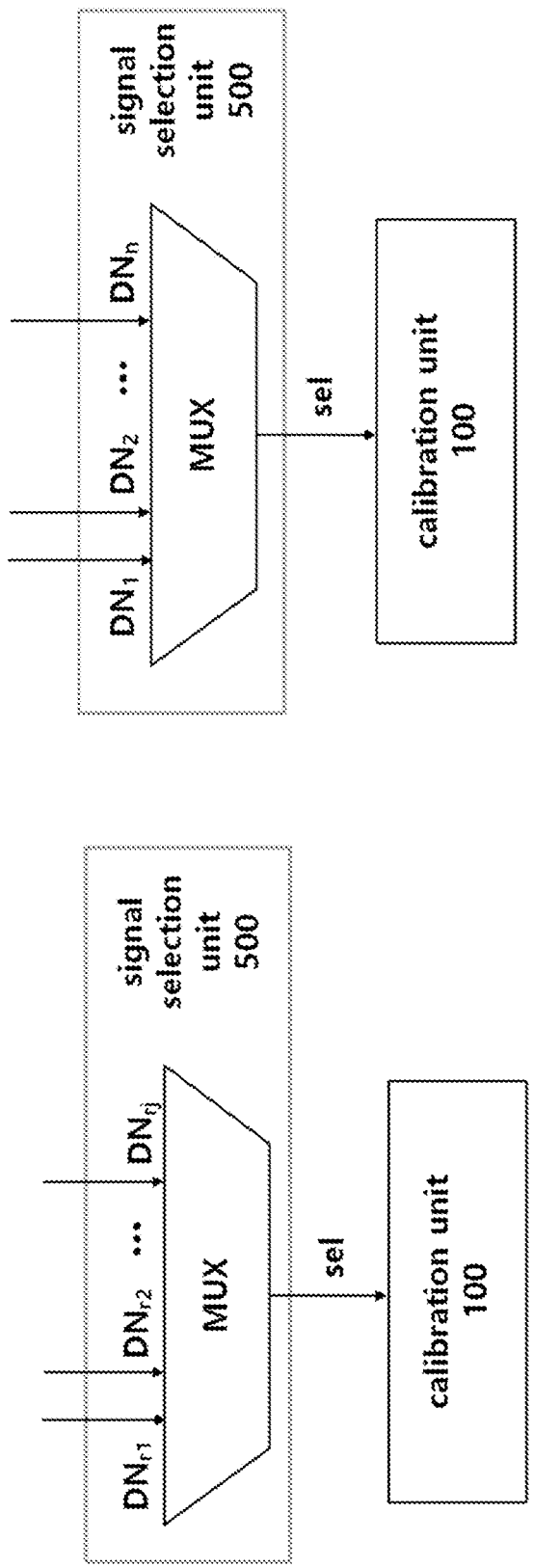

DISPLAY DEVICE AND METHOD OF CALIBRATING DRIVING TIME OF BOOST CIRCUIT

CROSS-REFERENCE TO RELATED APPLICATION

This application claims priority to Korean Patent Application No. 10-2020-0038874 (filed on Mar. 31, 2020), which is hereby incorporated by reference in its entirety.

BACKGROUND

The present invention relates to a display device and a method of calibrating a driving time of a boost circuit.

In displays, a switch connected to a pixel is turned on through a gate driver, and a voltage corresponding to a gray level to be expressed by the pixel is supplied using a source driver including a buffer. As the area, resolution, and frame rate of a display are increased, the resistance and capacitance of a load to be driven by a buffer are increased, and at the same time, a time required to drive the load is decreased.

SUMMARY

As an area and a frame rate of a display are increased, the necessity for a boost circuit, which is driven before a buffer is driven in order to drive a load including a pixel at a high speed, is arising.

However, since a deviation occurring in a process of forming a source driver and a size of a load appearing at an output of the source driver are changed according to the position of the display, there is a need to calibrate the boost circuit in order to supply a desired gradation voltage to the load using the boost circuit.

The present invention is directed to providing a method of calibrating a driving time of a boost circuit in order to supply a target gradation voltage to a load using a boost circuit.

A description of the present invention is merely an embodiment for a structural and/or functional description. The scope of the present invention should not be construed as being limited to embodiments described in the context. That is, the embodiments may be modified in various forms, and the scope of the present invention should be construed as including equivalents which may realize the technological spirit.

The meaning of terms described in this application should be construed as follows.

The terms, such as the "first" and the "second," are used to distinguish one element from another element, and the scope of the present invention should not be limited by the terms. For example, a first element may be named a second element. Likewise, a second element may be named a first element.

An expression used in the singular encompasses an expression of the plural, unless it has a clearly different meaning in the context, and it is to be understood that terms such as "including," "having," etc. are intended to indicate the existence of features, numbers, steps, operations, components, parts, or combinations thereof disclosed in the specification and are not intended to preclude the possibility that one or more other features, numbers, steps, operations, components, parts, or combinations thereof may exist or may be added.

The expression "and/or," when describing the embodiments of the present invention, is used to refer to all or one of the identified items. For example, the expression "A and/or B" should be understood as "A," "B," and "A and B."

In describing the embodiments of the present invention, a single line, a differential line, and a bus will be indiscriminately described unless otherwise described. However, when the single line, the differential line, and the bus need to be distinguished, the single line, the single line, the differential line, and the bus will be distinguished and described.

According to an aspect of the present invention, there is provided a method of calibrating a boost circuit including (a) resetting a load to a reference voltage, (b) supplying a charging voltage to the load through a boost circuit for a driving time such that charge sharing is performed in the load, (c) comparing a voltage of the load after the charge sharing with a target voltage, and (d) adjusting a duration of the driving time according to a result of step (c).

According to another aspect of the present invention, there is provided a display device for displaying an image including a data line driver which includes a buffer configured to supply a reference voltage to a load including pixels and a boost circuit configured to supply a charging voltage to the load including the pixels, and a calibration unit which controls the boost circuit to supply the charging voltage to the load for a driving time and controls the driving time according to a difference between a target voltage and a voltage formed after charge sharing is performed in the load to which the charging voltage is supplied.

According to still another aspect of the present invention, there is provided a method of calibrating a driving time of a plurality of boost circuits including dividing data line drivers including the plurality of boost circuits into a plurality of groups, performing driving time calibration on one or more boost circuits among the boost circuits divided into the plurality of groups, and performing driving time calibration on the remaining boost circuits.

BRIEF DESCRIPTION OF THE DRAWINGS

FIGS. 13A-13C show schematic diagrams illustrating a signal selection unit including a plurality of multiplexers in the embodiment illustrated in FIG. 12.

DETAILED DESCRIPTION

Figure 1:
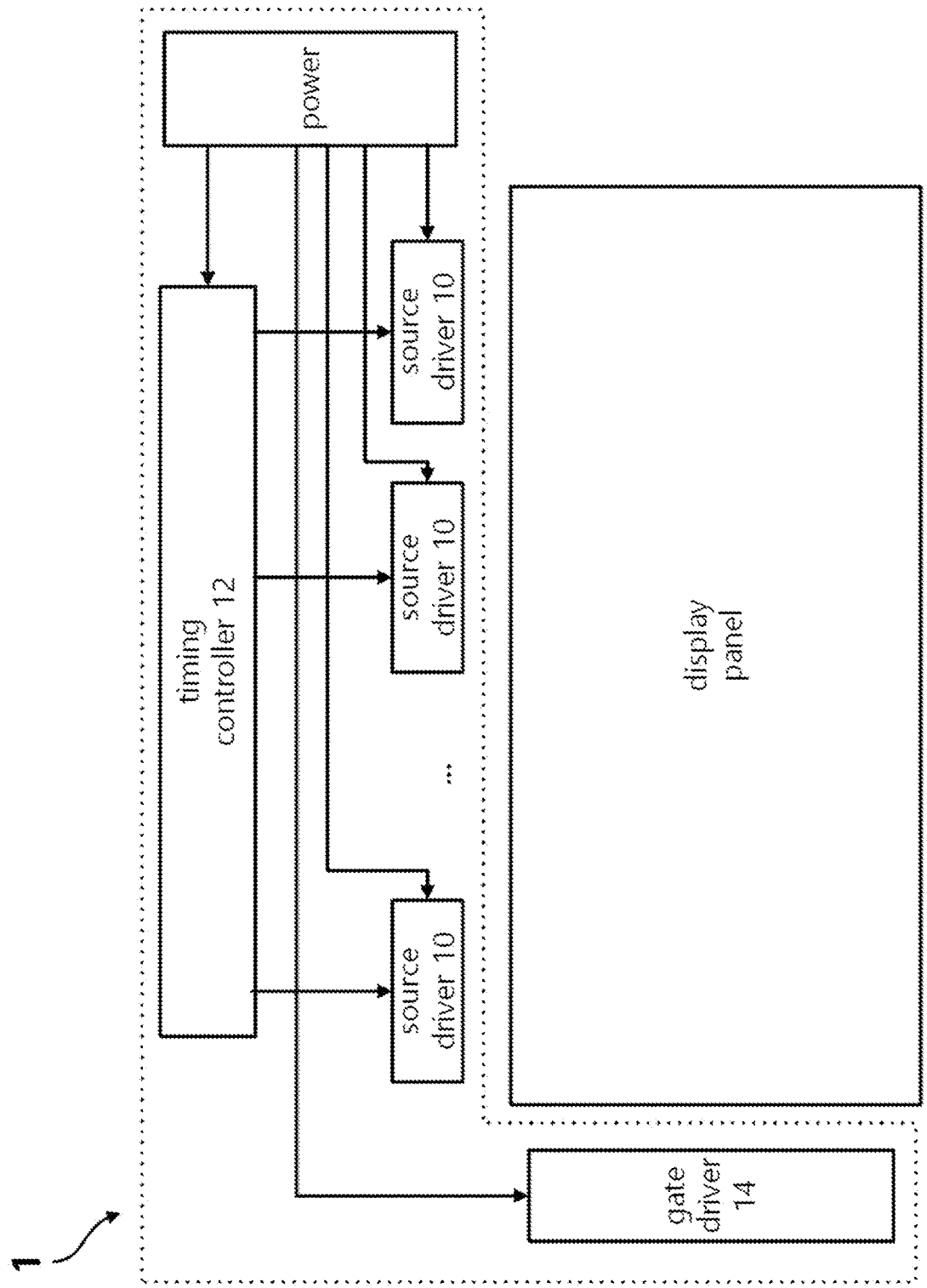
FIG. 1 is a schematic diagram illustrating a display device according to the present embodiment.

A display device and a method of calibrating a boost circuit according to the present embodiments will be described with reference to the accompanying drawings. FIG. 1 is a schematic diagram illustrating a display device according to the present embodiment. Referring to FIG. 1, a display device 1 according to the present embodiment includes a display panel, a gate driver 14, a source driver 10, and a timing controller that changes the characteristics of a screen source applied from the outside or adjusts a driving time according to the resolution and characteristics of a display system.

In one embodiment, a data line driver D (see FIG. 2) to be described below may be included in the source driver 10, and a calibration unit 100 (see FIG. 2) may be included in a timing controller 12 or the source driver 10.

Figure 2:
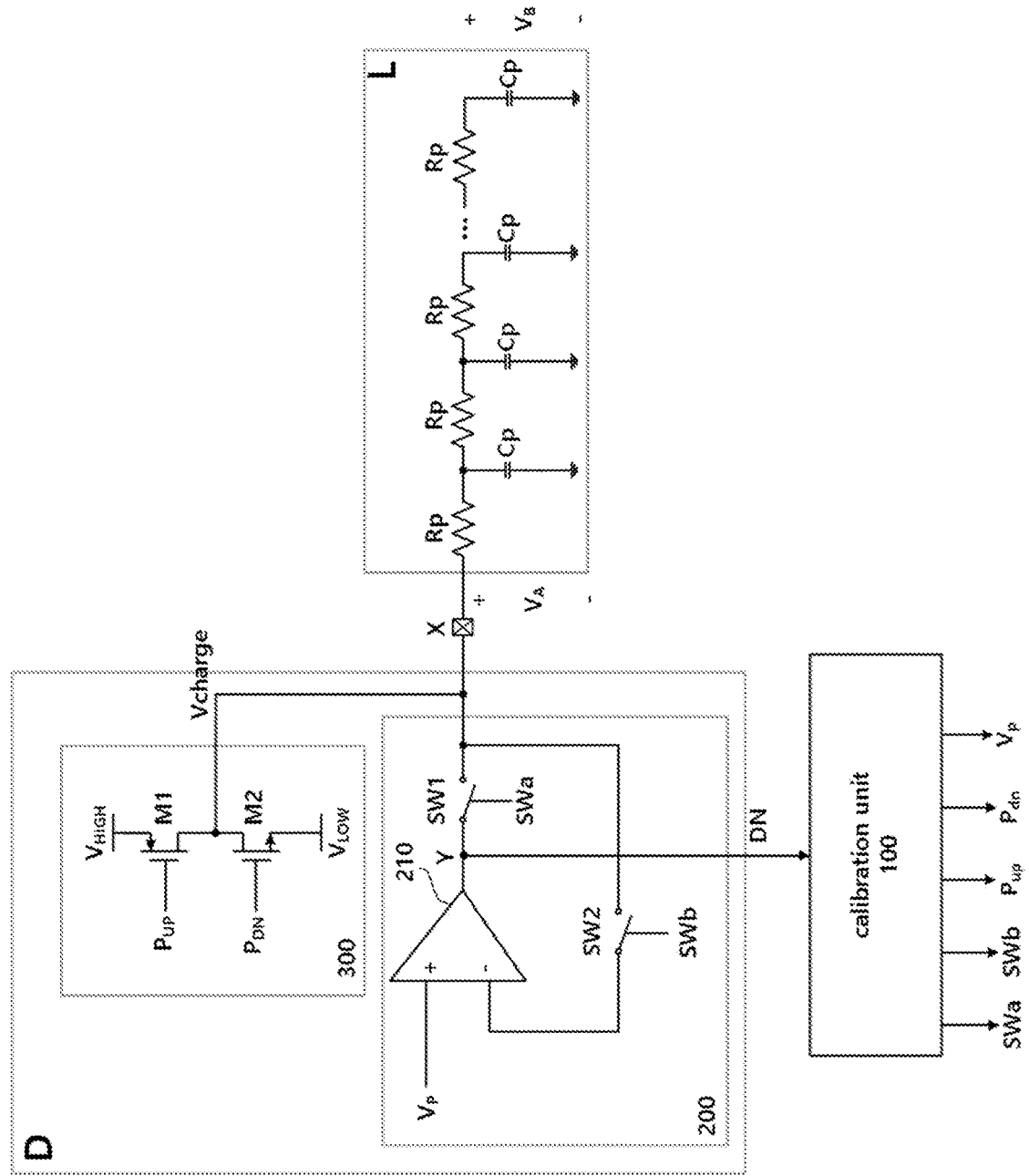
FIG. 2 is a schematic diagram illustrating a load and a data line driver including a boost circuit, a buffer, and a calibration unit according to the present embodiment.

FIG. 2 is a schematic diagram illustrating a load L and the data line driver D including a boost circuit 300, a buffer 200, and the calibration unit 100 according to the present embodiment. Referring to FIG. 2, the boost circuit 300 includes a first boost switch M1 that is turned on to output a first driving voltage $V_{HIGH}$ and a second boost switch M2 that is turned on to output a second driving voltage $V_{LOW}$. In the shown embodiment, the first boost switch M1 is a p-channel metal oxide semiconductor (PMOS) transistor, and the second boost switch M2 is an n-channel metal oxide semiconductor (NMOS) transistor. In an embodiment not shown, the first boost switch M1 and the second boost switch M2 may be semiconductor switches in which conduction and/or blocking of a first electrode and a second electrode are controlled based on a signal supplied to a control electrode. As an example, the first boost switch M1 and the second boost switch M2 may each be a transistor such as a bipolar junction transistor (BJT).

In one embodiment, the first driving voltage $V_{HIGH}$ supplied to the boost circuit 300 may be a voltage higher than the highest gradation voltage among gradation voltages supplied to a pixel, and the second driving voltage $V_{LOW}$ may be a voltage lower than the lowest gradation voltage among the gradation voltages supplied to the pixel. In another embodiment, the first driving voltage $V_{HIGH}$ and the second driving voltage $V_{LOW}$ supplied to the boost circuit 300 may be a driving voltage VDD and a ground voltage VSS supplied to the source driver 10 (see FIG. 1) and the timing controller 12 (see FIG. 1), respectively.

The buffer 200 may include an operational amplifier 210. The operational amplifier 210 may be connected in the form of a unit gain buffer having a feedback loop or a comparator having an open loop according to controlling first and second switches SW1 and SW2 to be turned on or off.

In one embodiment, the buffer 200 includes the first switch SW1 connected between an output node Y of the operational amplifier 210 and an output node X of the buffer. The turn-on and turn-off of the first switch SW1 are controlled based on a first switch control signal SWa. The buffer 200 includes the second switch SW2 connected between the output node X of the buffer 200 and an inverting input terminal of the operational amplifier 210. The turn-on and turn-off of the second switch SW2 are controlled based on a second switch control signal SWb. A signal $V_p$ supplied by the calibration unit 100 may be supplied to a non-inverting input terminal of the operational amplifier 210.

In one embodiment, each of the first switch SW1 and the second switch SW2 may include a control electrode, a first electrode, and a second electrode and may be a semiconductor switch in which the turn-on and/or turn-off of the first electrode and the second electrode are controlled based on a signal supplied to the control electrode. The first switch SW1 and the second switch SW2 may be, for example, a transistor such as an NMOS transistor, a PMOS transistor, a negative-positive-negative (NPN) BJT, or a positive-negative-positive (PNP) BJT.

Hereinafter, an example will be described in which the first switch SW1 and the second switch SW2 are a semiconductor switch that is turned on by receiving a control signal in a logic high state. However, this is for concise description, and a person skilled in the art can easily implement the first switch SW1 and the second switch SW2 as the semiconductor switch that is turned on by receiving the control signal in a logic high state.

In one embodiment, the calibration unit 100 receives a comparison result signal DN (see FIG. 8) output by the operational amplifier 210. In another embodiment, the calibration unit 100 receives a comparison result signal DN (see FIG. 9) output by a comparator 400. The calibration unit 100 may output the first and second switch control signals SWa and SWb for controlling the first and second switches SW1 and SW2, a first boost switch control signal $P_{UP}$ for controlling the first boost switch M1 included in the boost circuit 300, a second boost switch control signal $P_{DN}$ for controlling the second boost switch M2, and the signal $V_P$ supplied to the non-inverting input terminal of the operational amplifier 210. In addition, the calibration unit 100 may output a target voltage $V_{TARGET}$ to the comparator 400 (see to FIGS. 9, 15A, 15B, and 15C), and the calibration unit 100 may output signals for controlling multiplexers included in a signal selection unit 500 (see FIGS. 13A-13C and 15A-15C).

Referring again to FIG. 2, the load L is driven by the data line driver D. The load L includes data lines transmitting a gradation voltage and a plurality of pixels connected to the data lines to receive the gradation voltage and display an image. As illustrated in FIG. 2, the load L may be equivalently modeled through connections of resistors Rp and capacitors Cp.

FIG. 2 illustrates the load L connected to a single data line, one data line driver D, and the boost circuit 300 and one buffer 200 included in the data line driver D. The source driver 10 may include a plurality of data line drivers $D_1$, $D_2$, ..., and $D_n$ (see FIGS. 12 and 14).

Figure 3:
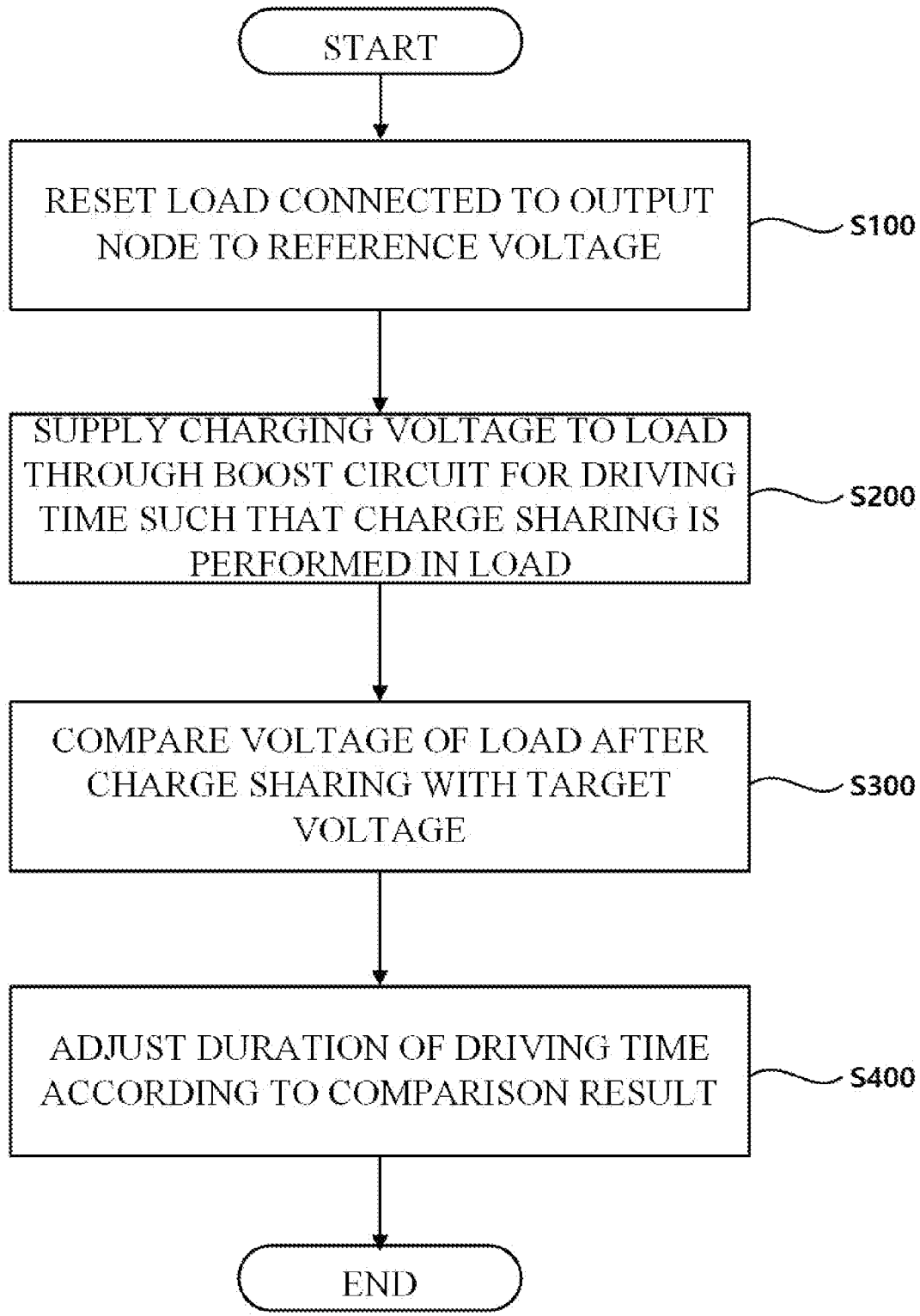
FIG. 3 is a schematic flowchart illustrating a method of calibrating a driving time of the boost circuit according to the present embodiment.
Figure 4:
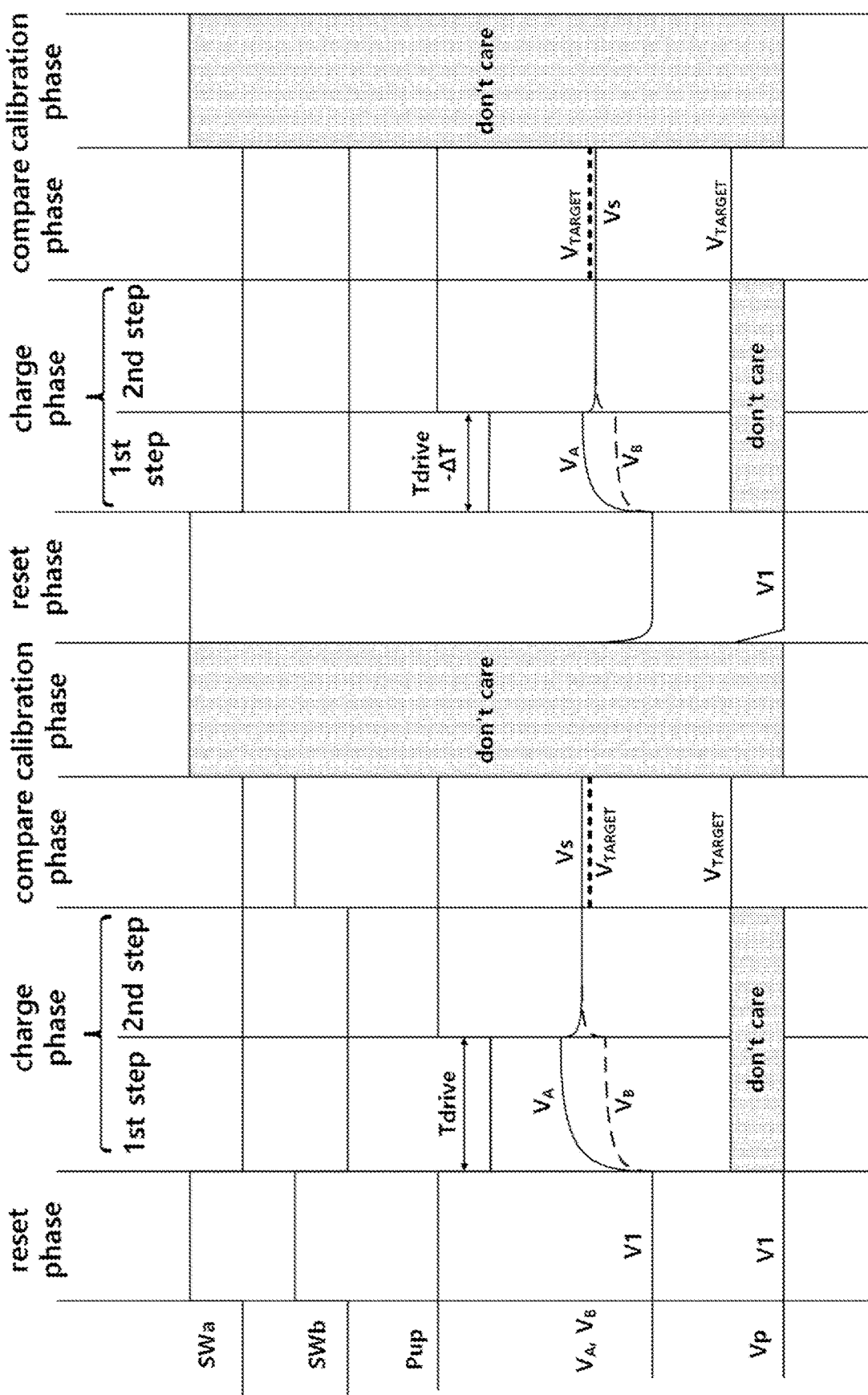
FIG. 4 is a timing diagram of a case where the boost circuit is calibrated according to the method of calibrating the boost circuit according to the present embodiment.
Figure 5:
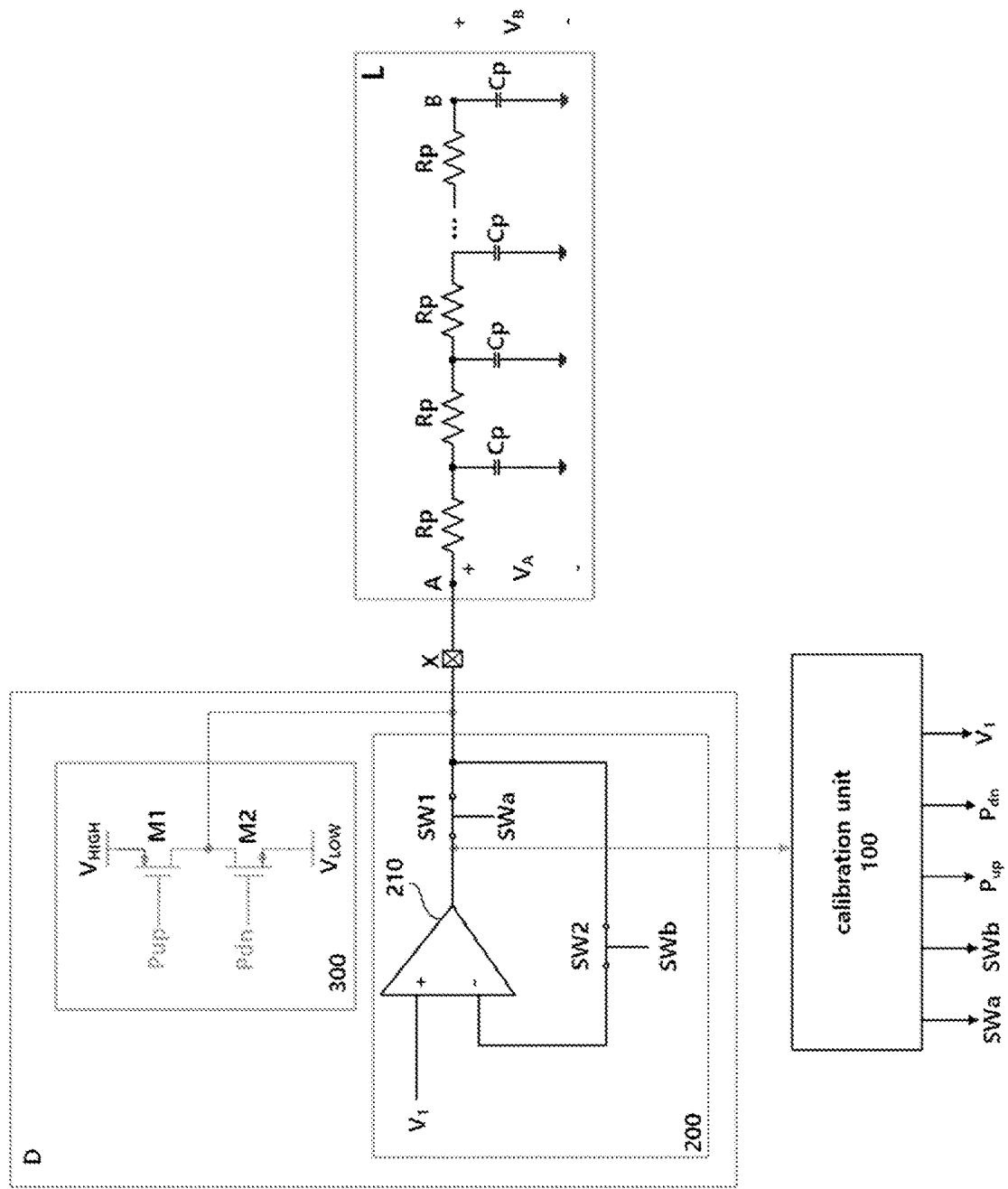
FIG. 5 is an equivalent circuit diagram in the reset phase.

FIG. 3 is a schematic flowchart illustrating a method of calibrating a driving time of the boost circuit 300 according to the present embodiment, and FIG. 4 is a timing diagram of a case where the boost circuit 300 is calibrated according to the method of calibrating the boost circuit 300 according to the present embodiment. FIG. 5 is an equivalent circuit diagram in the reset phase S100. Referring to FIGS. 3 to 5, in the reset phase S100, the load L is reset to a reference voltage V1.

In one embodiment, the calibration unit 100 supplies the signal SWa in a logic high state to turn the first switch SW1 on and supplies the signal SWb in a logic high state to turn the second switch SW2 on.

The calibration unit 100 supplies the reference voltage V1 to the non-inverting input terminal of the operational amplifier 210. In one embodiment, the reference voltage V1 may be a voltage that is lower than the first driving voltage $V_{HIGH}$ of the boost circuit 300 and is higher than the second driving voltage $V_{LOW}$ thereof. In addition, the reference voltage V1 may be a voltage higher than a ground voltage GND.

The calibration unit 100 outputs the signal $P_{UP}$ in a logic high state and the signal $P_{DN}$ in a logic low state so that both the first boost switch M1 and the second boost switch M2 of the boost circuit 300 are turned off.

Hereinafter, an example will be described in which the target voltage $V_{TARGET}$ to be formed in the load L through the boost circuit 300 is higher than the reference voltage V1. This is merely an example for description, and from the following description, a person skilled in the art can easily implement the second switch M2 included in the boost circuit 300 so as to be driven when the target voltage $V_{TARGET}$ to be supplied through the boost circuit 300 is lower than the reference voltage V1.

The reset phase S100 is maintained for a sufficient time such that a voltage of the entire load L is reset to the reference voltage V1 supplied to the output node X of the buffer. Accordingly, a voltage of the load L including a voltage of the output node X of the buffer 200, a voltage of a first node A of the load, and a voltage of an end node B of the load is maintained at the reference voltage V1.

The charge phase S200 may include a first step in which the boost circuit 300 supplies a charging voltage $V_{CHARGE}$ to the load L for a driving time $T_{drive}$ in the first step of supplying the charging voltage $V_{CHARGE}$ to the load L and a second step in which charge sharing is performed in the load L by the charging voltage $V_{CHARGE}$. In the first step, the boost circuit 300 supplies the charging voltage $V_{CHARGE}$ to the load L for the driving time $T_{drive}$.

Figure 6:
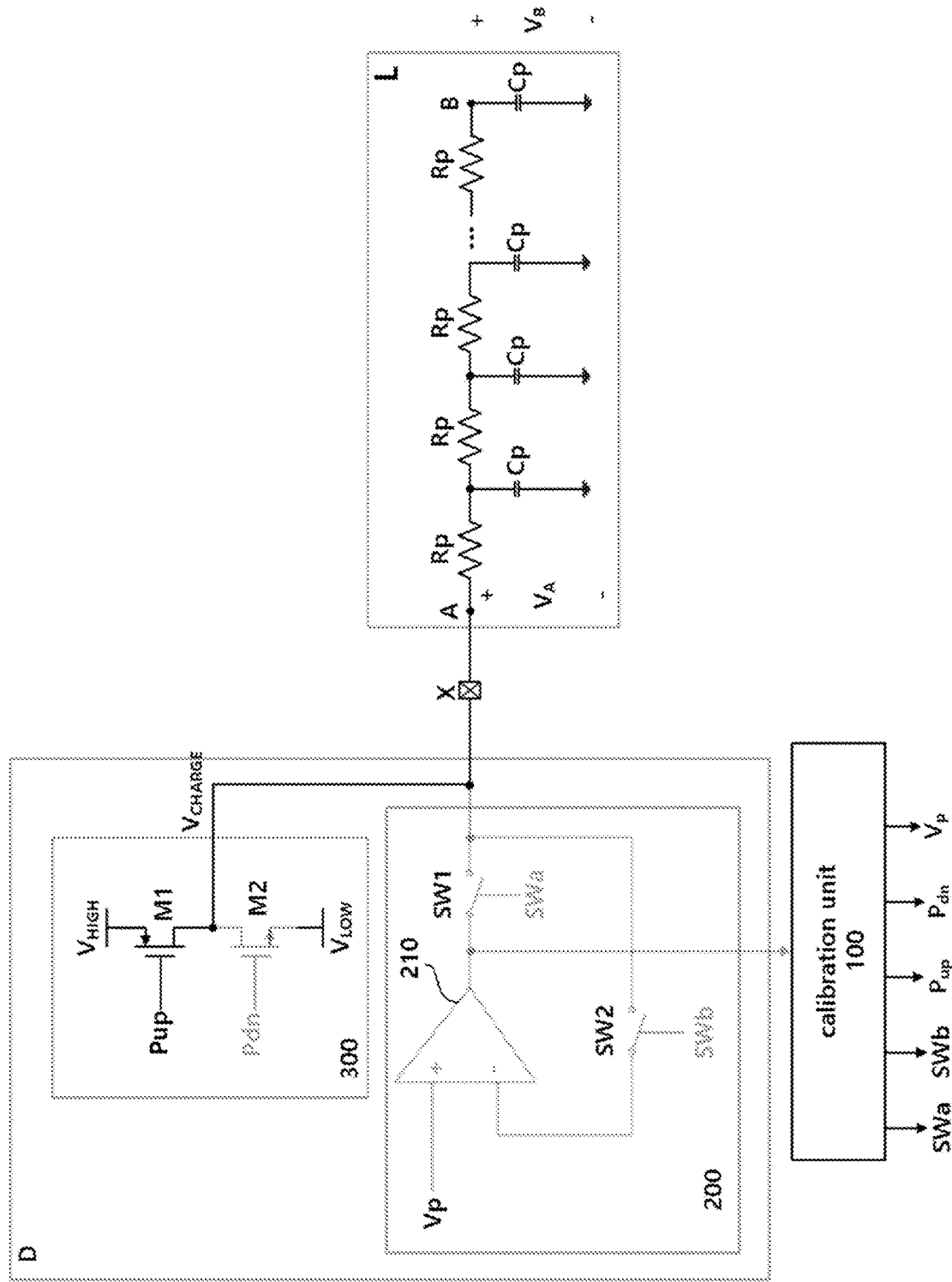
FIG. 6 is a schematic equivalent circuit diagram in a first step of the charge phase.

FIG. 6 is a schematic equivalent circuit diagram in the first step of the charge phase. Referring to FIGS. 3, 4, and 6, in the first step, the calibration unit 100 outputs the first and second switch control signals SWa and SWb so that both the first and second switches SW1 and SW2 are turned off. The first and second switches SW1 and SW2 are turned off to prevent a time delay due to unnecessary charging of the output node of the operational amplifier 210 and a feedback path of the operational amplifier 210.

The calibration unit 100 supplies the first and second switch control signals $P_{UP}$ and $P_{DN}$ so that the second boost switch M2 is turned off and the first driving voltage $V_{HIGH}$ is supplied to the load L as the charging voltage $V_{CHARGE}$ through the first boost switch M1.

The boost circuit 300 supplies the charging voltage $V_{CHARGE}$, and thus, in FIG. 4, a voltage $V_A$ in the first node A of the load L indicated by a solid line and a voltage $V_B$ in the end node B of the load L indicated by a broken line are increased. The voltage $V_B$ of the end node B of the load L is formed as a voltage lower than the voltage $V_A$ due to the resistors Rp and the capacitors Cp of the load L.

Figure 7:
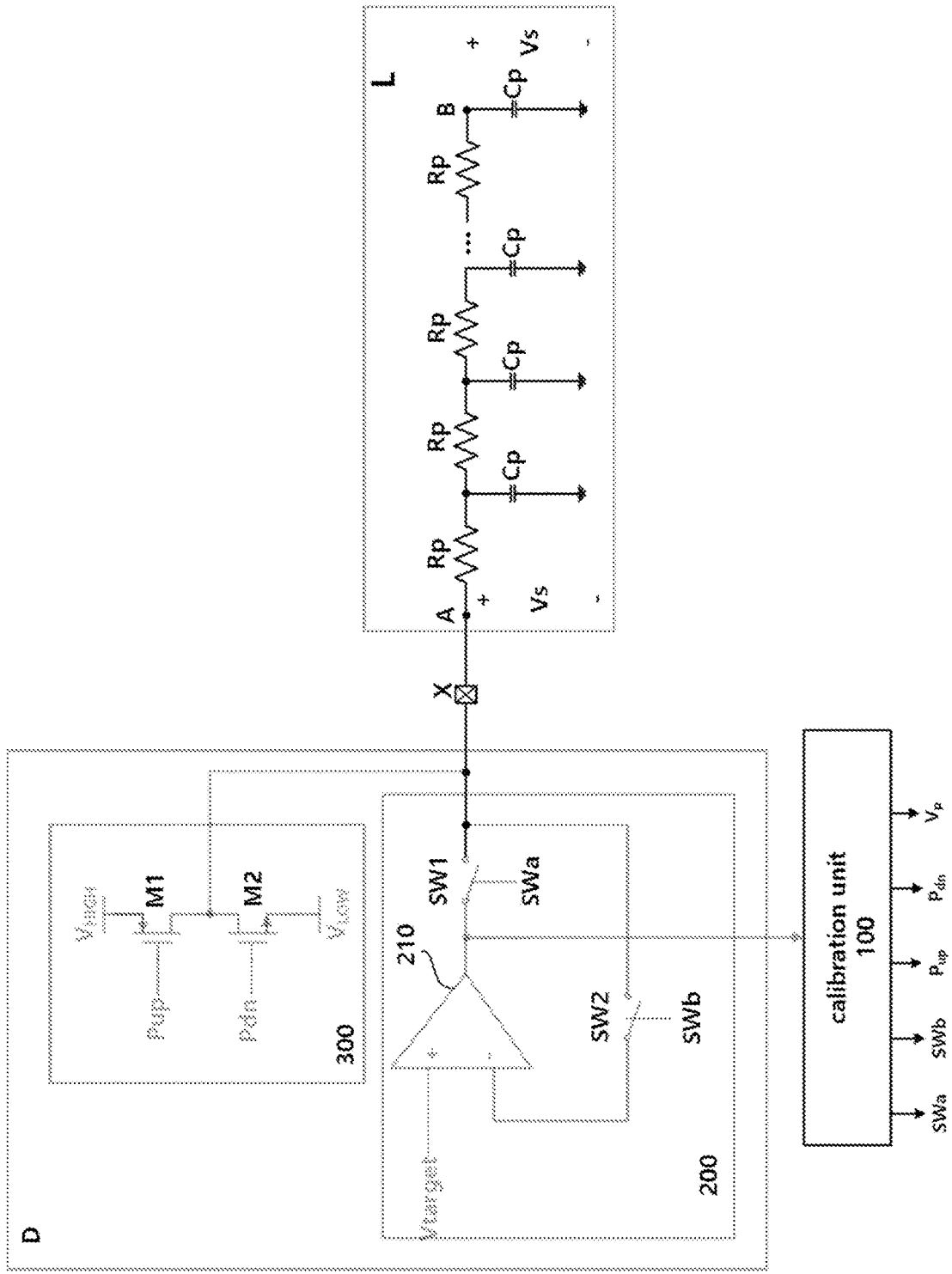
FIG. 7 is a schematic equivalent circuit diagram in a second step of the charge phase.

FIG. 7 is a schematic equivalent circuit diagram in the second step of the charge phase. Referring to FIGS. 3, 4, and 7, in the second step, the calibration unit 100 outputs the first switch control signal SWa, the second switch control signal SWb, the first boost switch control signal $P_{UP}$, and the second boost switch control signal $P_{DN}$ so that all of the first switch SW1, the second switch SW2, the first boost switch M1, and the second boost switch M2 are turned off. Therefore, the load L is not connected to the data line driver D.

In the second step, charge sharing occurs between the capacitors Cp of the load L. The voltage of the first node A of the load and the voltage of the end node B of the load are equally formed as a voltage $V_S$ through the charge sharing. After the charge sharing, a magnitude of the voltage $V_S$ formed in the load may be smaller than that of the voltage $V_A$ formed in the node A but may be greater than that of the voltage $V_B$ formed in the node B in the first step.

As will be described below, the calibration unit 100 controls the driving time $T_{drive}$ during which the first boost switch M1 and/or the second boost switch M2 are turned on to supply a voltage to the load, thereby controlling the voltage $V_S$ formed after the charge sharing.

As an example, a voltage in the first node A of the load may be detected, but since the end node B of the load is a final pixel node of the display panel, a voltage at an end of the display panel may not be detected. Therefore, the second step may be performed for a sufficient time until the same voltage is formed in the entire load.

Figure 8:
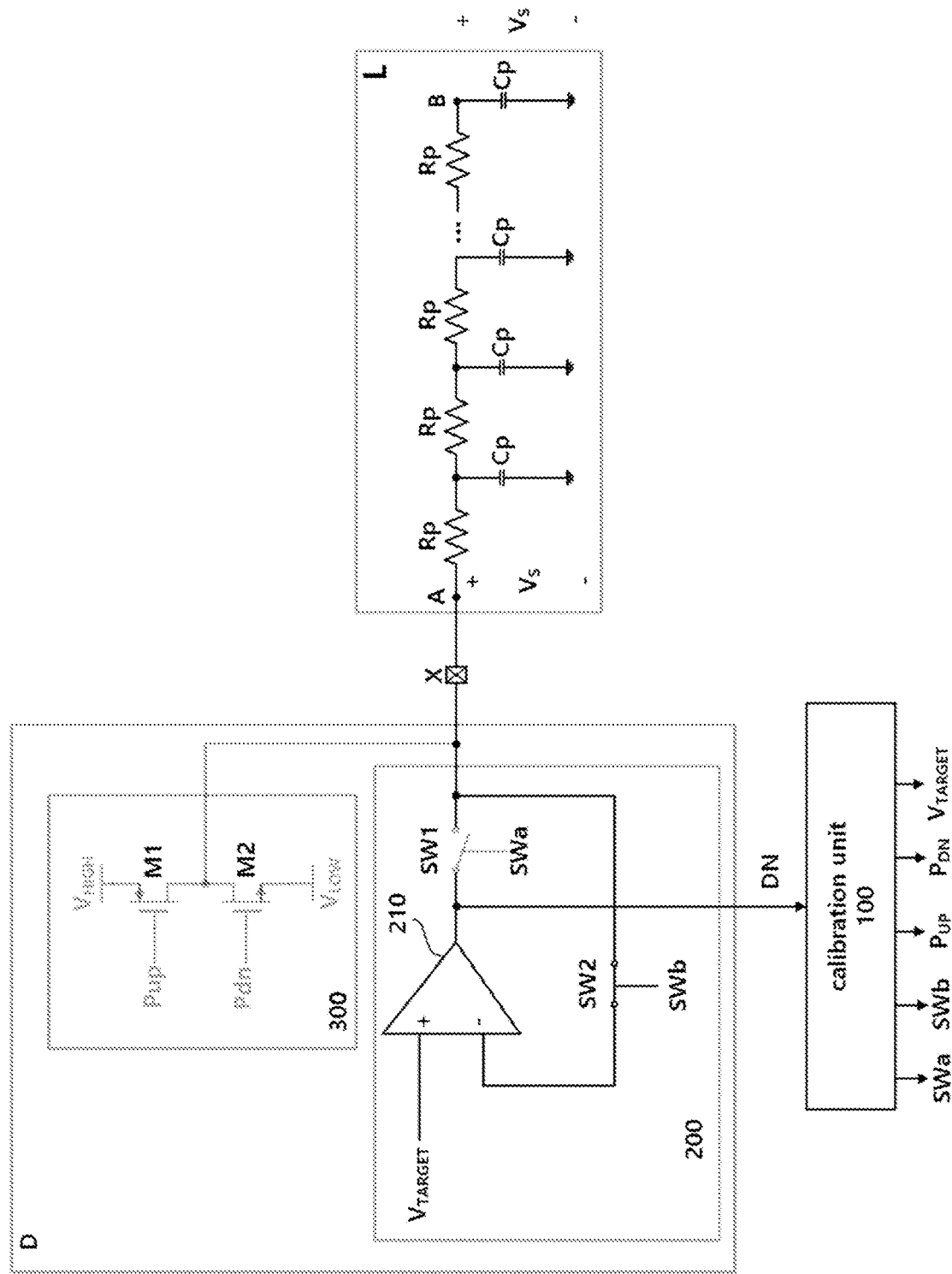
FIG. 8 is a schematic circuit diagram of a first embodiment in the compare phase.

FIG. 8 is a schematic circuit diagram of a first embodiment in the compare phase S300. Referring to FIGS. 3, 4, and 8, in the compare phase, the voltage $V_S$ of the load after the charge sharing is compared with the target voltage $V_{TARGET}$. In one embodiment, the calibration unit 100 supplies the target voltage $V_{TARGET}$ to the non-inverting input terminal of the operational amplifier 210. In addition, the calibration unit 100 outputs the second switch control signal SWb, after the charge sharing, to turn the second switch SW2 on such that the voltage $V_S$ of the load is supplied to the inverting input terminal of the operational amplifier 210.

After the charge sharing, the voltage $V_S$ formed in the load L is supplied to the inverting input terminal of the operational amplifier 210, and the target voltage $V_{TARGET}$ is supplied to the non-inverting input terminal thereof. The operational amplifier 210 compares the voltage $V_S$ formed in the load L after the charge sharing with the target voltage $V_{TARGET}$ to output a comparison result as a comparison result signal DN.

In one embodiment, when the target voltage $V_{TARGET}$ supplied to the non-inverting input terminal is higher than the voltage $V_S$ formed in the load, the operational amplifier 210 outputs a logic high signal as the comparison result signal DN. When the voltage $V_S$ of the load supplied to the inverting input terminal after the charge sharing is higher than the target voltage $V_{TARGET}$, the operational amplifier 210 outputs a logic low signal as the comparison result signal DN.

In the embodiment illustrated in FIG. 8, when the first switch SW1 is turned on, an output signal of the operational amplifier 210 may be supplied to the output node X of the buffer. Accordingly, the calibration unit 100 outputs the first switch control signal SWa so that the first switch SW1 is turned off.

When the display device is driven, the operational amplifier 210 of the present embodiment functions as a component of a buffer that supplies a gradation voltage to a pixel. However, when the boost circuit 300 is calibrated, as described above, the operational amplifier 210 may function as a comparator for comparing the voltage formed in the load L with the target voltage.

Figure 9:
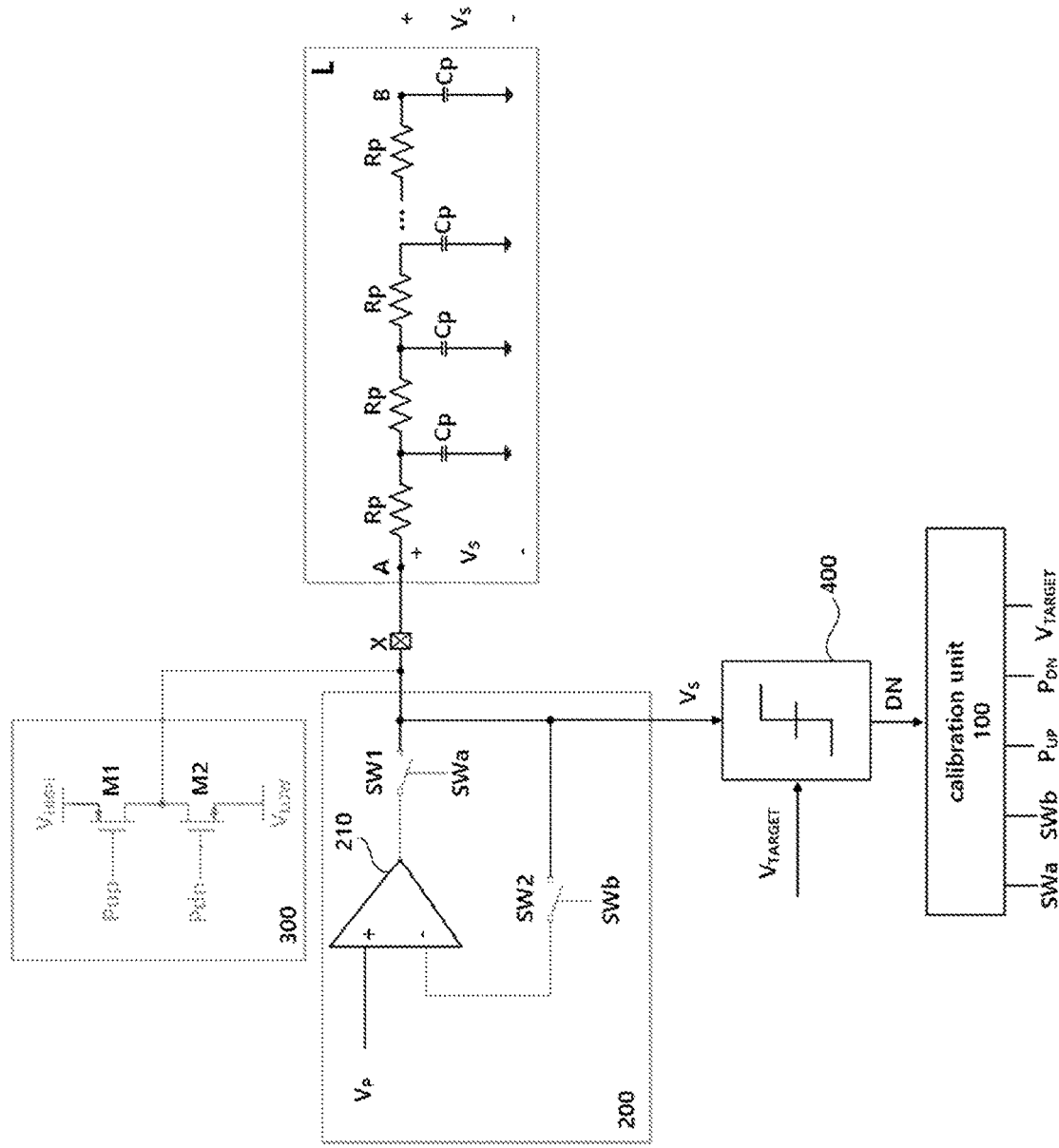
FIG. 9 is a schematic circuit diagram of a second embodiment in the compare phase.

FIG. 9 is a schematic circuit diagram of a second embodiment in the compare phase. Referring to FIG. 9, in the second embodiment of the compare phase, the comparator 400 may compare the target voltage $V_{TARGET}$ with the voltage $V_S$ formed in the load after the charge sharing.

In the second embodiment of the compare phase, the calibration unit 100 supplies the first switch control signal SWa and the second switch control signal SWb so that both the first switch and the second switch are turned off. After the charge sharing, the voltage $V_S$ of the load is supplied as one input of the comparator 400. The target voltage $V_{TARGET}$ supplied by the calibration unit 100 may be supplied as the other input of the comparator 400. The comparator 400 compares the target voltage $V_{TARGET}$ with the charge-shared voltage $V_S$ of the load to supply a comparison result signal DN corresponding to a comparison result to the calibration unit 100.

As an example, when the target voltage $V_{TARGET}$ is higher than the voltage $V_S$ formed in the load after the charge sharing, the comparator 400 outputs a logic high signal as the comparison result signal DN. When the voltage $V_S$ formed in the load after the charge sharing is higher than the target voltage $V_{TARGET}$, the comparator 400 outputs a logic low signal as the comparison result signal DN.

For another example, when the target voltage $V_{TARGET}$ is higher than the voltage $V_S$ formed in the load after the charge sharing, the comparator 400 outputs a logic low signal. On the contrary, when the voltage $V_S$ formed in the load after the charge sharing is higher than the target voltage $V_{TARGET}$, the comparator 400 outputs a logic high signal as the comparison result signal DN.

In one embodiment, the comparator 400 may be a comparator that converts analog signals supplied as one or more inputs into digital signals and compares and outputs the supplied signals. In another embodiment, the comparator 400 may be a comparator that converts digital signals supplied as one or more inputs into analog signals and compares and outputs the supplied signals.

As an example, the comparator 400 may convert the charge-shared voltage $V_S$ of the load supplied as one input into a digital code and may compare the digital code with the target voltage $V_{TARGET}$, which is a digital code supplied as the other input by the calibration unit 100, thereby outputting the comparison result signal DN.

For another example, the comparator 400 may convert a digital code supplied as the other input by the calibration unit 100 to form the target voltage $V_{TARGET}$, which is an analog voltage, and may compare the target voltage $V_{TARGET}$ with the charge-shared voltage $V_S$ of the load supplied as one input, thereby outputting the comparison result signal DN.

Figure 10A:
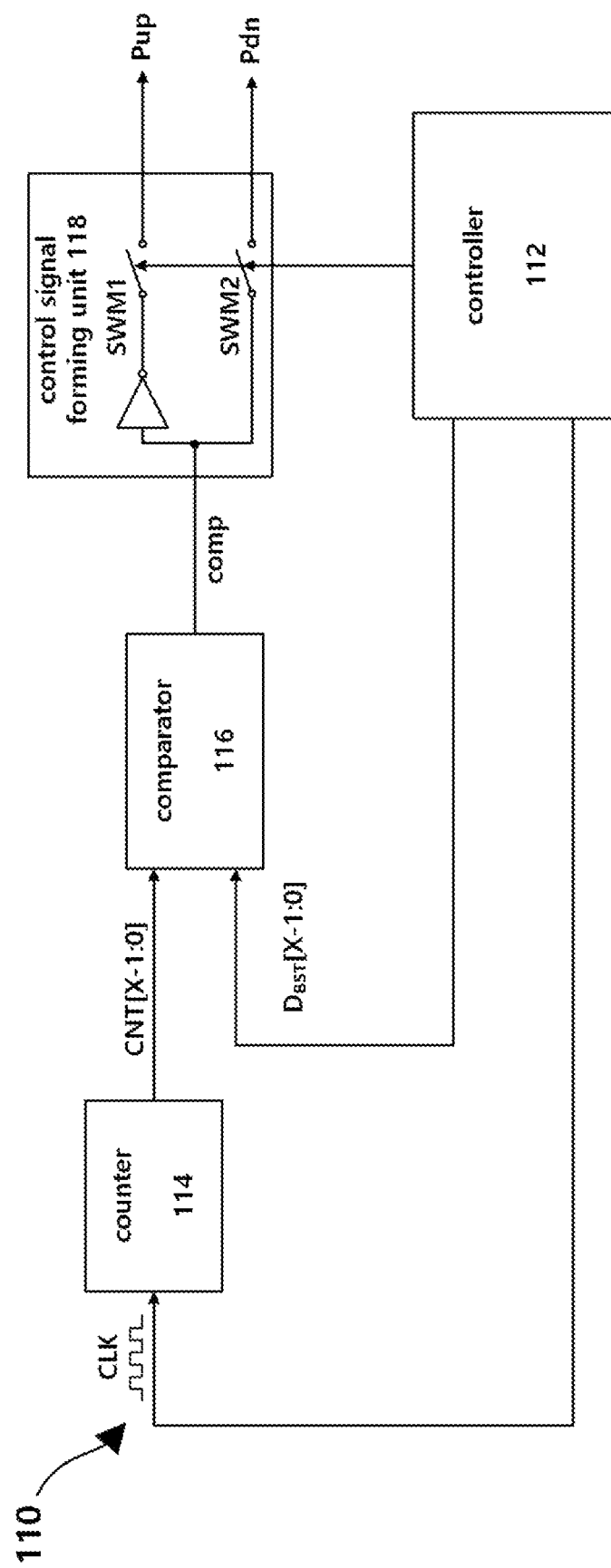
FIG. 10A is a schematic diagram illustrating a configuration of a driving time setting unit of a calibration unit.
Figure 10B:
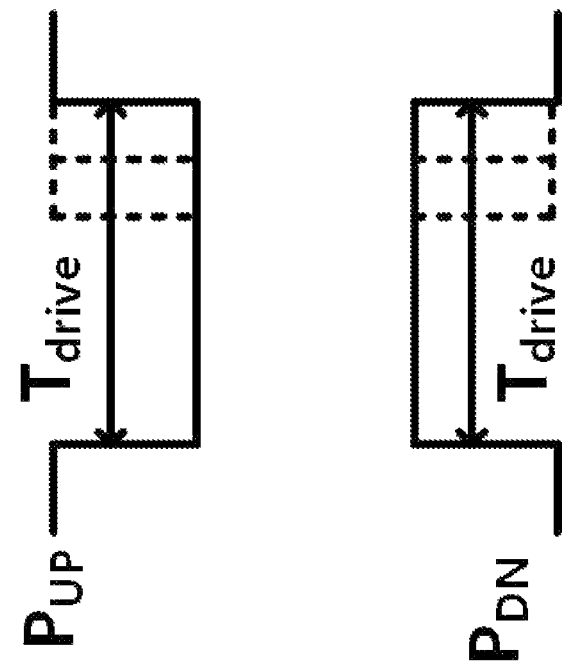
FIG. 10B is a graph for describing the operation of the driving time setting unit.
Figure 10C:
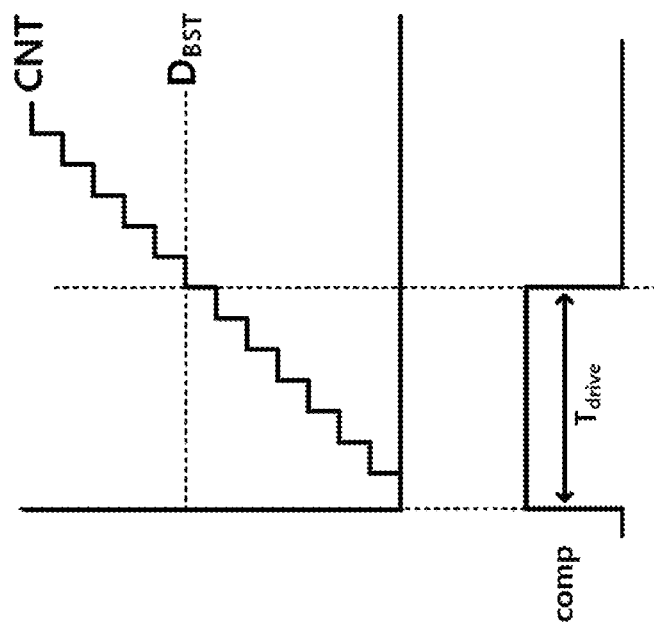
FIG. 10C is a diagram illustrating schematic shapes of a first boost switch control signal and a second boost switch control signal output by the driving time setting unit.
Figure 11:
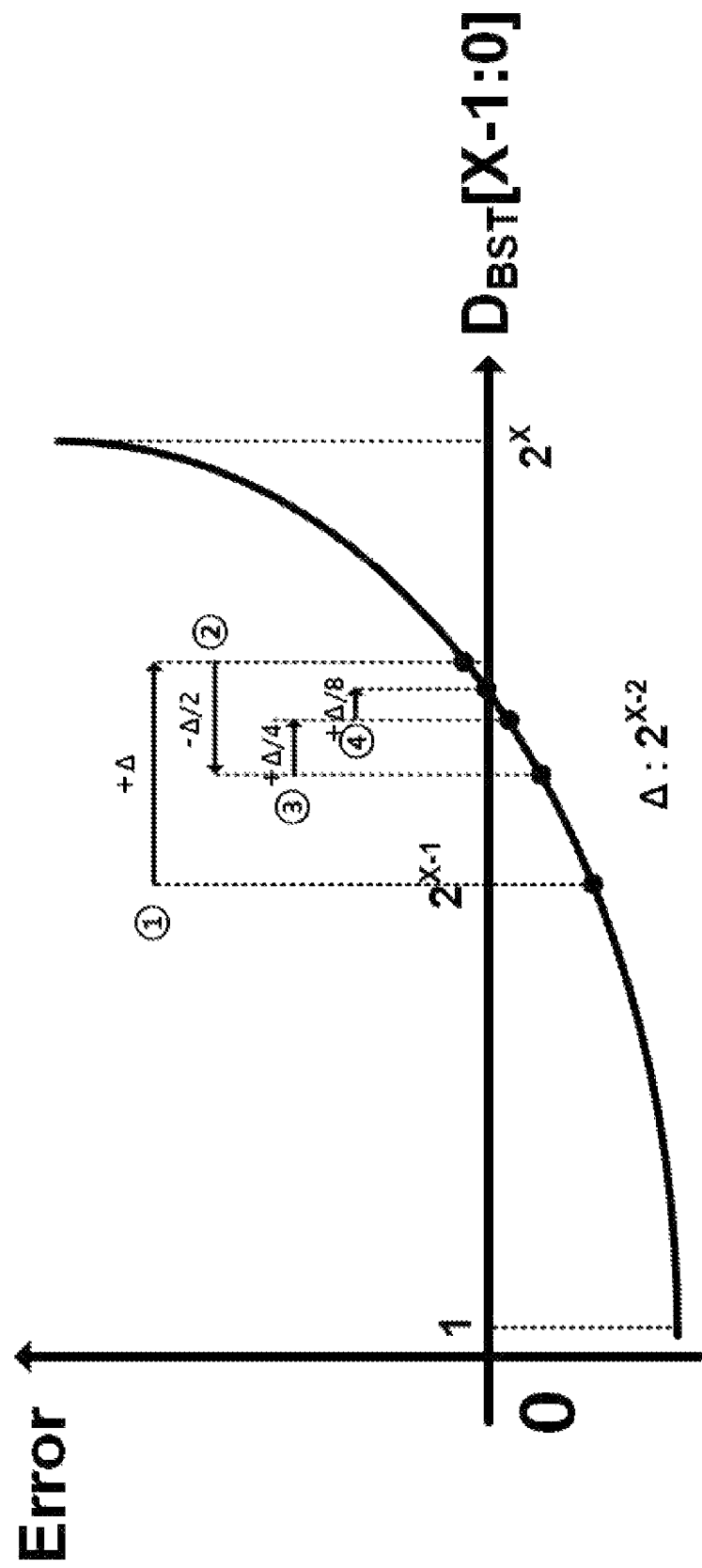
FIG. 11 is a schematic graph for describing a process in which a controller calibrates a driving time of the boost circuit.

In the calibration phase S400, the calibration unit 100 adjusts a driving time of the boost circuit 300. FIG. 10A is a schematic diagram illustrating a configuration of a driving time setting unit 110 of the calibration unit 100. FIG. 10B is a graph for describing the operation of the driving time setting unit 110. FIG. 10C is a diagram illustrating schematic shapes of a first boost switch control signal $P_{UP}$ and a second boost switch control signal $P_{DN}$ output by the driving time setting unit 110. FIG. 11 is a schematic graph for describing a process in which a controller 112 calibrates a driving time $T_{drive}$ of the boost circuit.

Referring to FIG. 10A, the driving time setting unit 110 included in the calibration unit 100 includes a counter 114 that receives a clock signal CLK and counts the number of pulses included in the clock signal CLK to output a counting result, a comparator 116 that compares a counting result signal CNT output by the counter 114 with a driving time control code $D_{BST}$ output by the controller 112, a control signal forming unit 118 that forms the first boost switch control signal $P_{UP}$ or the second boost switch control signal $P_{DN}$ having a desired driving time from a comparison result of the comparator 116, and the controller 112 that supplies the clock signal CLK and performs calibration on the boost circuit 300 by outputting the driving time control code $D_{BST}$ corresponding to the driving time of the first boost switch control signal $P_{UP}$ or the second boost switch control signal $P_{DN}$.

Referring to FIGS. 10A and 10B, the counter 114 counts the number of the pulses included in the clock signal CLK output from the controller 112 to output the counting result. In one embodiment, the counting result output by the counter 114 may be the total of X bits of [X−1 to 0], and the counter 114 may output the counting result signal CNT increased one by one as the number of the pulses included in the clock signal CLK is counted.

The comparator 116 compares the counting result signal CNT output by the counter 114 with a size of the driving time control code $D_{BST}$ output by the controller 112 and outputs a comparison signal comp corresponding to a comparison result. The driving time control code $D_{BST}$ may have the same bit number of [X−1 to 0] as the counting result signal CNT output by the counter 114.

An upper graph of FIG. 10B shows a relationship between the counting result signal CNT increased when the number of the pulses in the clock signal CLK is counted by the counter 114 and the driving time control code $D_{BST}$ supplied by the controller 112. The comparator 116 maintains the comparison signal comp in a logic high state during driving, and when a value of the counting result signal CNT is greater than or equal to a value corresponding to the driving time control code $D_{BST}$, the comparator 116 converts the logic high state into a logic low state to form and output the comparison signal comp. Accordingly, as shown in a lower graph of FIG. 10B, the comparison signal comp has a pulse width corresponding to a time for the counting result signal CNT to be increased from zero to intersect the driving time control code $D_{BST}$.

In an embodiment not shown, the comparator 116 may maintain the comparison signal comp in a logic low state at the time of initial driving, and when a value of the counting result signal CNT is greater than or equal to a value corresponding to the driving time control code $D_{BST}$, the comparator 116 may convert the logic low state into a logic high state to form and output the comparison signal.

The control signal forming unit 118 receives the comparison signal comp and outputs the first boost switch control signal $P_{UP}$ or the second boost switch control signal $P_{DN}$. In the present embodiment, the calibration unit 100 calibrates the driving time $T_{drive}$ of the first boost switch M1. Accordingly, the controller 112 turns the second boost switch M2 off and turns the first boost switch M1 on to invert the comparison signal comp and to form and output the first boost switch control signal $P_{UP}$ (see an upper side of FIG. 10C) having a pulse width corresponding to the desired driving time $T_{drive}$. In another embodiment, when the driving time $T_{drive}$ of the second boost switch M2 is to be calibrated, the controller 112 turns the first boost switch M1 off and turns the second boost switch M2 on to form and output the second boost switch control signal $P_{DN}$ (see lower side of FIG. 10C) having a pulse width corresponding to the desired driving time $T_{drive}$.

Hereinafter, the calibration phase S400 will be described with reference to FIGS. 10 and 11. FIG. 11 shows a voltage error Error corresponding to a difference between the voltage $V_S$ of the load after the charge sharing and the target voltage $V_{TARGET}$ according to the driving time control code $D_{BST}$ input to the counter 114. In FIG. 11, a case where the voltage error Error has a negative value corresponds to a case where the voltage $V_S$ of the load after the charge sharing is lower than the target voltage $V_{TARGET}$, and a case where the voltage error Error has a positive value corresponds to a case where the voltage $V_S$ of the load after the charge sharing is higher than the target voltage $V_{TARGET}$.

Referring to FIGS. 10 and 11, the controller 112 supplies the driving time control code $D_{BST}$ corresponding to the driving time $T_{drive}$ of the boost circuit 300 to the comparator 116. The controller 112 supplies an initial value of the driving time control code $D_{BST}$ to the comparator 116 at the start of the calibration of the boost circuit 300. The driving time setting unit 110 drives the boost circuit 300 based on the driving time $T_{drive}$ corresponding to the initial value of the input driving time control code $D_{BST}$.

In one embodiment, the initial value of the driving time control code $D_{BST}$ may be a median value (2X−1) of values corresponding to the total of all X bits of [X−1 to 0] of the driving time control code. As an example, when the driving time control code includes the total of 10 bits, the driving time control code may be a code corresponding to a median value of [0000 0111 11] from [0000 0000 00] to [1111 1111 11].

When the comparison result signal DN supplied to the calibration unit 100 corresponds to a case where the voltage $V_S$ of the load after the charge sharing is higher than the target voltage $V_{TARGET}$, the calibration unit 100 decreases and supplies the driving time control code $D_{BST}$ such that the driving time of the boost circuit 300 is decreased. As the driving time control code $D_{BST}$ is decreased, the driving time $T_{drive}$ of the boost circuit 300 is decreased.

When the comparison result signal DN supplied to the calibration unit 100 corresponds to a case where the voltage $V_S$ of the load after the charge sharing is lower than the target voltage $V_{TARGET}$, the calibration unit 100 increases and supplies the driving time control code $D_{BST}$ such that the driving time of the boost circuit 300 is increased. As the driving time control code $D_{BST}$ is increased, the driving time $T_{drive}$ of the boost circuit 300 is increased.

An embodiment, in which the driving time of the second boost switch M2 is adjusted to form the target voltage $V_{TARGET}$ lower than the reference voltage V1 (see FIG. 4) in the load L after charge sharing, may be performed as follows. When the comparison result signal DN corresponds to a case where the voltage $V_S$ formed in the load after the charge sharing is lower than the target voltage $V_{TARGET}$, the calibration unit 100 decreases and supplies the driving time control code $D_{BST}$ such that the driving time of the second boost switch M2 is decreased. When the comparison result signal DN corresponds to a case where the voltage $V_S$ formed in the load after the charge sharing is higher than the target voltage $V_{TARGET}$, the calibration unit 100 increases and supplies the driving time control code $D_{BST}$ such that the driving time of the second boost switch M2 is increased.

The compare phase is performed again from the comparison result signal DN detected in a compare phase subsequent to the calibration phase to increase or decrease a subsequent data value by half of a previous variation amount. When the driving time control code includes X bits and when the driving time of the boost circuit is calibrated X times, a difference between the target voltage $V_{TARGET}$ and the voltage $V_S$ may be calibrated within a predetermined range.

In the embodiment illustrated in FIG. 11, after $2^{X-1}$, which is a median value of values of the total of X bits, is supplied as the initial value of the driving time control code $D_{BST}$, the voltage error Error in an initial comparison phase corresponds to a case where the voltage $V_S$ is lower than the target voltage $V_{TARGET}$. In a subsequent calibration phase ①, the controller 112 increases the driving time control code $D_{BST}$ by Δ.

The driving time setting unit 110 controls the boost circuit 300 by outputting a signal having a pulse width corresponding to the driving time control code $D_{BST}$ in which the variation amount Δ is reflected. In one embodiment, the variation amount Δ of a counter input may correspond to $2^{X-2}$, which is half of an initial value supplied to the counter.

In a subsequent comparison phase, since the voltage error Error corresponds to a case where the voltage $V_S$ is higher than the target voltage $V_{TARGET}$, in a calibration phase ②, the controller 112 decreases an input of the counter 114 by Δ/2, which is half of the previous variation amount, to output the decreased input to the counter. The driving time setting unit 110 controls the boost circuit 300 by outputting a signal having a corresponding pulse width.

In a subsequent comparison phase, since the voltage error Error corresponds to a case where the voltage $V_S$ is lower than the target voltage $V_{TARGET}$, in a calibration phase ③, the controller 112 increases an input of the counter 114 by Δ/4, which is half of the previous variation amount, to output the increased input to the counter 114. The driving time setting unit 110 controls the boost circuit 300 by outputting a signal having a corresponding pulse width.

In a subsequent comparison phase, since the voltage error Error corresponds to a case where the voltage $V_S$ is lower than the target voltage $V_{TARGET}$, in a calibration phase ④, the controller 112 increases an input of the counter 114 by Δ/8, which is half of the previous variation amount, to output the increased input to the counter 114. The driving time setting unit 110 controls the boost circuit 300 by outputting a signal having a corresponding pulse width.

In one embodiment, the calibration unit 100 performs a calibration process including the reset phase, the charge phase, the compare phase, and the calibration phase as many times as the number of the bits included in the driving time control code $D_{BST}$, thereby completing the calibration of the boost circuit 300 included in the corresponding data line driver D. As an example, when the driving time control code $D_{BST}$ includes the total of X bits of [X−1 to 0], the calibration process may be performed X times.

As described above, by performing driving time calibration in which half of the previous variation amount is added or subtracted, the calibration unit 100 may form the maximum error between the charged-shared voltage $V_S$ of the load and the target voltage $V_{TARGET}$ as a value corresponding to a least significant bit (LSB) of the driving time control code $D_{BST}$.

The display panel (see FIG. 1) includes the plurality of pixels connected to the plurality of data lines. The plurality of data lines and the plurality of pixels may cause errors in a manufacturing process, and electrical characteristics thereof may be different due to the errors.

Accordingly, boost circuits for driving the plurality of data lines may be adjusted differently from each other. Hereinafter, a process of calibrating boost circuits included in a plurality of data line drivers will be described with reference to FIGS. 12 to 15C.

Figure 12:
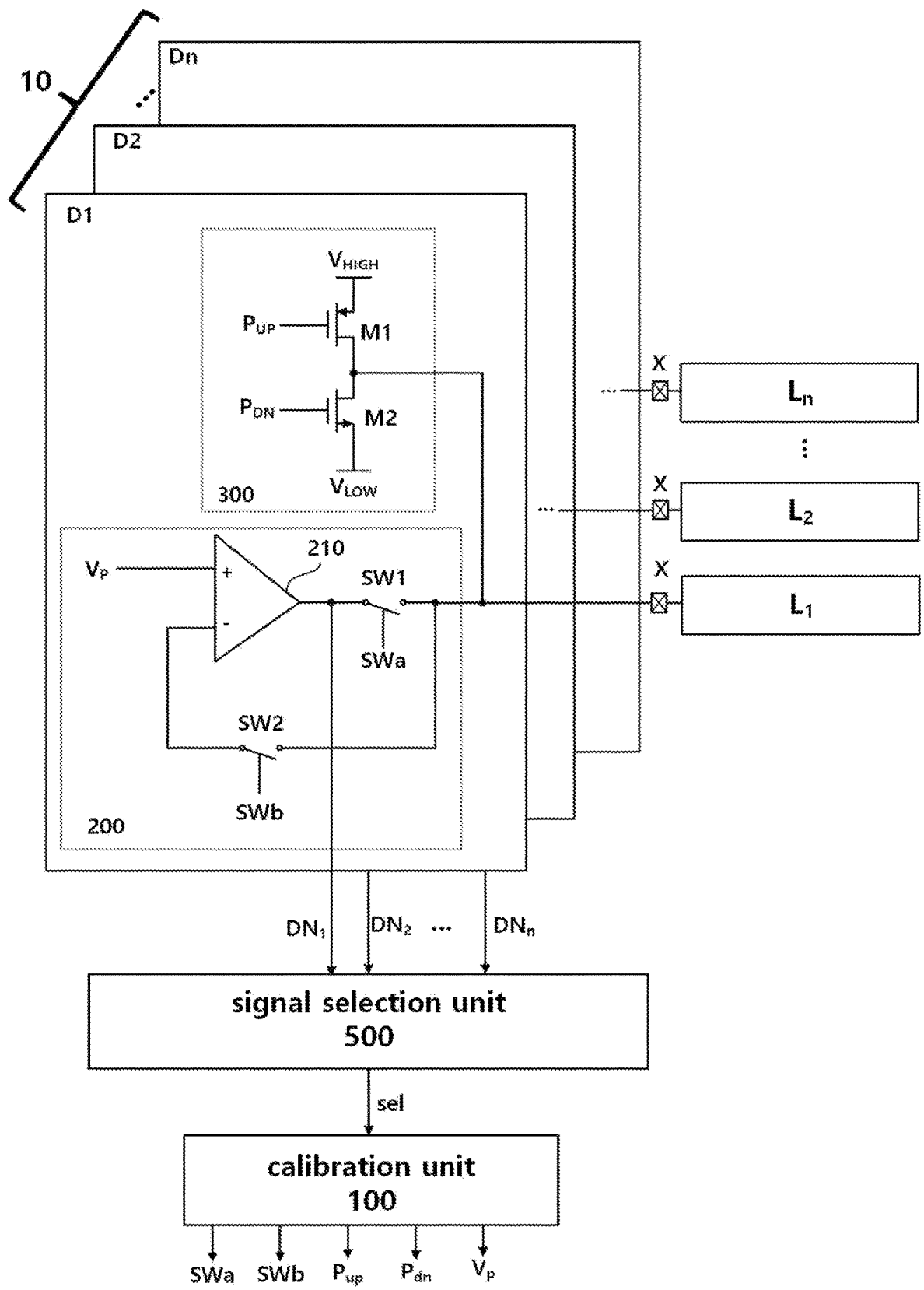
FIG. 12 is a schematic diagram illustrating a plurality of data line drivers included in a source driver according to a first embodiment.

FIG. 12 is a schematic diagram illustrating a plurality of data line drivers $D_1, D_2, \ldots,$ and $D_n$ included in a source driver 10 according to a first embodiment, and FIGS.

13A-13C show schematic diagrams illustrating a signal selection unit 500 including a plurality of multiplexers MUX1, MUX2, . . . , and MUXj in the embodiment illustrated in FIG. 12.

Referring to FIGS. 12 and 13A-13C, n data line drivers $D_1, D_2, \ldots,$ and $D_n$ may be divided into j groups, and each group may include k data line drivers. Assuming that the number of the data line drivers included in the source driver 10 is n, the number may be represented by n=j×k (wherein n, j, and k are a natural number).

In the embodiment illustrated in FIGS. 12 and 13A-13C, the data line drivers $D_1, D_2, \ldots,$ and $D_n$ may be divided into a first group of $D_1, D_2, \ldots,$ and $D_k$, a second group of $D_{k+1}$, $D_{k+2}, \ldots,$ and $D_{2k}, \ldots,$ and a $j^{th}$ group of $D_{n-k+1}, D_{n-k+2}$, . . . , and $D_n$.

The signal selection unit 500 may include as many multiplexers MUX1, MUX2, . . . , and MUXj as the number of the groups. A calibration unit 100 may output a multiplexer control signal (not shown) to perform a control such that signals input to the multiplexers MUX1, MUX2, . . . , and MUXj are selected and output.

Figure 13A:
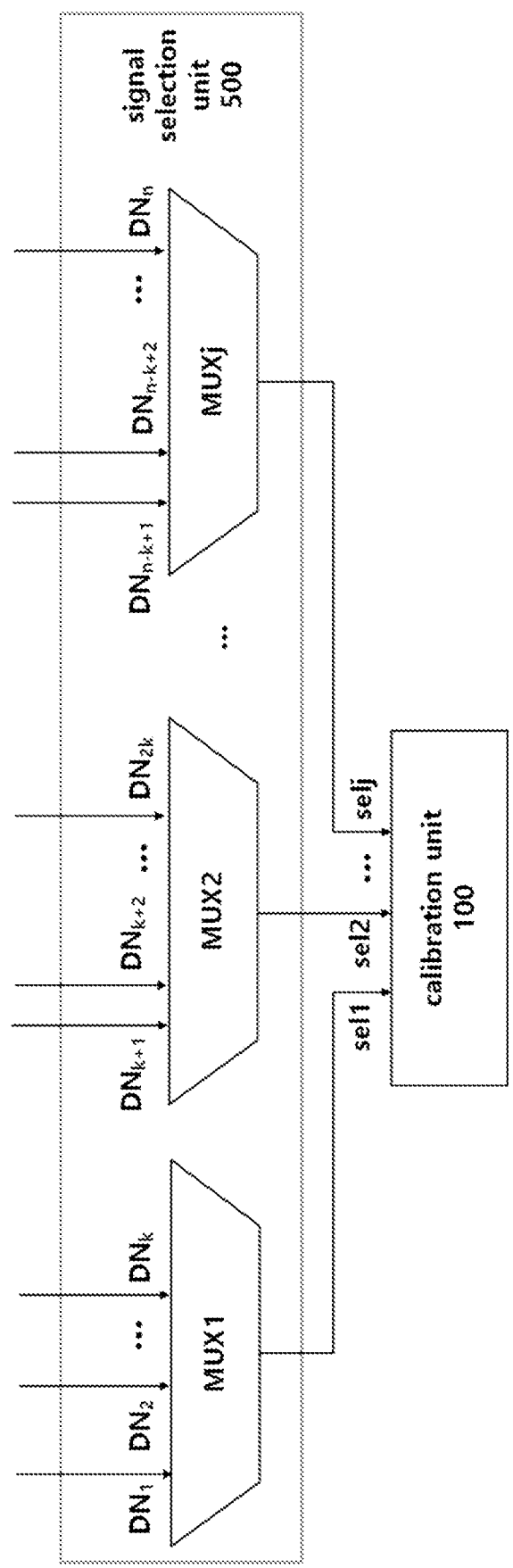

In the embodiment illustrated in FIG. 13A, comparison signals $D_1, D_2, \ldots,$ and $DN_k$ output by the data line drivers $D_1, D_2, \ldots,$ and $D_k$ belonging to the first group are input to a first multiplexer MUX1. Comparison signals $DN_{k+1}, DN_{k+2}, \ldots,$ and $DN_{2k}$ output by the data line drivers $D_{k+1}, D_{k+2}, \ldots,$ and $D_{2k}$ belonging to the second group are input to a second multiplexer MUX2. Similarly, comparison signals $D_{n-k+1}, D_{n-k+2}, \ldots,$ and $DN_n$ output by the data line drivers $D_{n-k+1}, D_{n-k+2}, \ldots,$ and $D_n$ belonging to the $j^{th}$ group are input to a $j^{th}$ multiplexer MUXj. The comparison signals $DN_1, DN_2, \ldots,$ and $DN_n$ output by the data line drivers $D_1, D_2, \ldots,$ and $D_n$ belonging to the J groups in total are supplied to the multiplexers MUX1, MUX2, . . . , and MUXj for every group to which the data line drivers $D_1, D_2, \ldots,$ and $D_n$ belong.

The first multiplexer MUX1 outputs one of the comparison signals $DN_1, DN_2, \ldots,$ and $DN_k$ input in response to a control signal (not shown) output by the calibration unit 100 as a selection signal sel1, and each of the plurality of multiplexers outputs one of the comparison signals input in response to the control signal output by the calibration unit 100 as a selection signal.

According to an embodiment not shown, the multiplexers may output a plurality of selection signals, and the calibration unit may output a control signal such that the multiplexers output the plurality of selection signals.

The calibration unit 100 may perform boost circuit calibration on the selected number of the data line drivers for each group and may sequentially perform boost circuit calibration on the remaining data line drivers belonging to the groups. As an example, the calibration unit 100 selects the data line driver $D_1$, the data line driver $D_{k+1}, \ldots,$ and the data line driver $D_{n-k+1}$ from the first group, the second group, . . . , and the $j^{th}$ group and performs calibration on boost circuits included in the corresponding data line drivers. After the calibration on the selected data line drivers is completed, boost circuit calibration may be performed in parallel for every group as in a method of performing calibration on boost circuits included in the data line driver $D_2$ in the first group, the data line driver $D_{k+2}$ in the second group, . . . , and the data line driver $D_{n-k+2}$ in the $j^{th}$ group.

In an embodiment not shown, the boost circuit calibration may be performed for each group. As an example, the calibration unit 100 may perform calibration through a method of first completing calibration on boost circuits included in the data line drivers belonging to one group of the plurality of groups and then performing calibration on boost circuits belonging to another group.

In the embodiment illustrated in FIG. 13B, one representative data line driver selected from among the data line drivers belonging to the first group, the second group, . . . , and the $j^{th}$ group supplies comparison result signals $DN_{r1}$, $DN_{r2}, \ldots,$ and $DN_{rj}$ to the signal selection unit 500. The calibration unit 100 performs calibration on a boost circuit included in a representative data line driver of each group. After the calibration on the boost circuit of the representative data line driver is completed, the calibration unit 100 may collectively calibrate boost circuits 300 included in the corresponding group using a boost circuit calibration result. According to another embodiment not shown, calibration may be performed on two or more representative data line drivers for each group, and calibration may be performed on boost circuits belonging to the corresponding group using a calibration result.

In the embodiment illustrated in FIG. 13C, the data line drivers $D_1, D_2, \ldots,$ and $D_n$ output comparison result signals $DN_1, DN_2, \ldots,$ and $DN_n$, respectively. The calibration unit 100 may control the signal selection unit 500 to sequentially perform calibration on the boost circuits included in the plurality of data line drivers $D_1, D_2, \ldots,$ and $D_n$. In the embodiment illustrated in FIG. 13C, calibration is performed on a boost circuit included in one data line driver among the plurality of data line drivers $D_1, D_2, \ldots,$ and $D_n$. Subsequently, calibration is sequentially performed on the boost circuits included in the remaining data line drivers.

However, according to another embodiment not shown, the multiplexer MUX may perform boost circuit calibration by supplying comparison result signals supplied by two or more data line drivers to the calibration unit 100.

Figure 14:
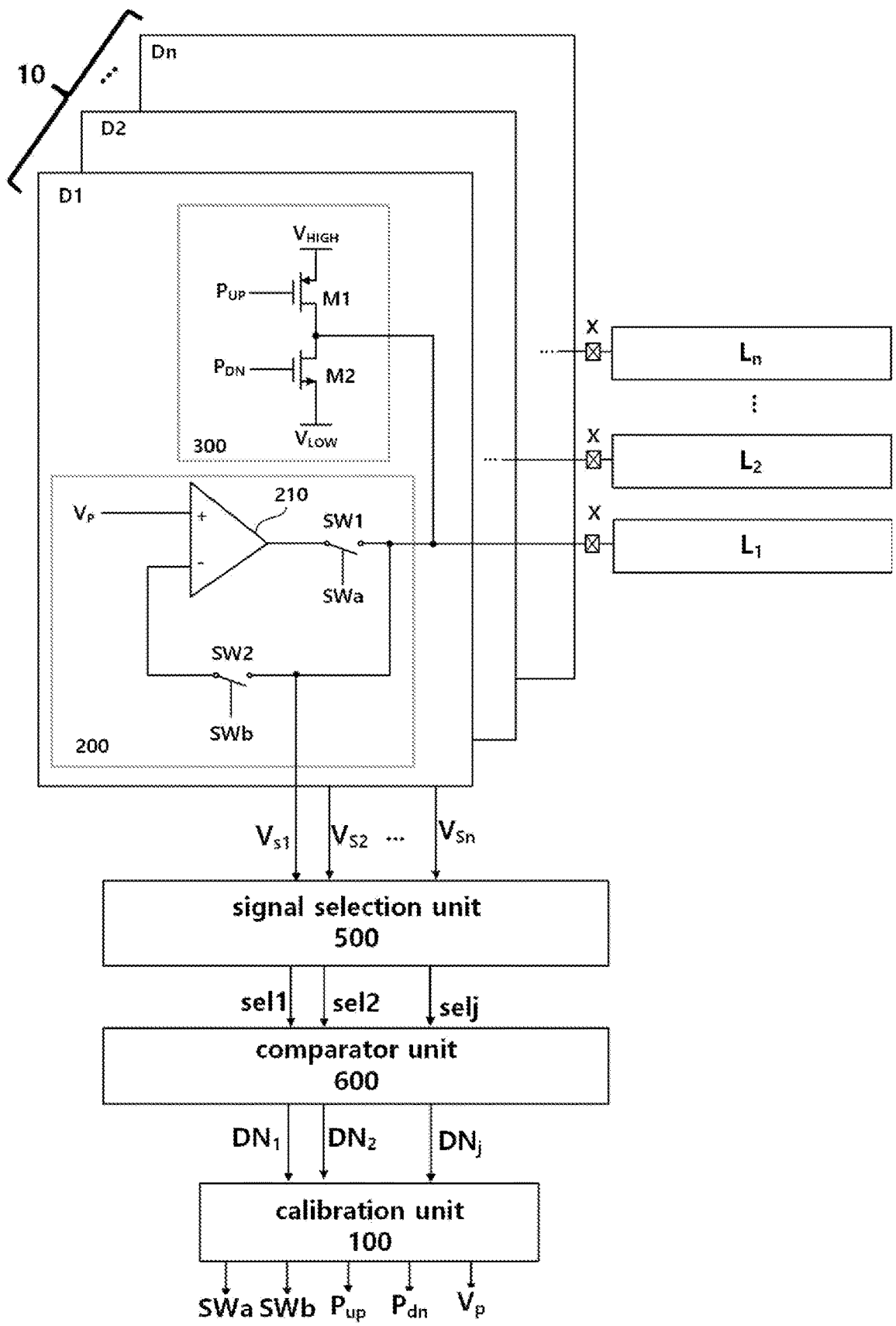
FIG. 14 is a schematic diagram for describing driving time calibration on boost circuits included in data line drivers according to another embodiment.

FIG. 14 is a schematic diagram for describing driving time calibration on boost circuits included in a plurality of data line drivers illustrated in FIG. 9, and FIGS. 15A-15C show schematic diagrams illustrating a signal selection unit 500 and a comparator unit 600 of FIG. 14.

In the embodiment illustrated in FIGS. 14 and 15A-15C, data line drivers $D_1, D_2, \ldots,$ and $D_n$ may belong to a first group of $D_1, D_2, \ldots,$ and $D_k$ a second group of $D_{k+1}, D_{k+2}$, . . . , and $D_{2k}$, and a $j^{th}$ group of $D_{n-k+1}, D_{n-k+2}, \ldots,$ and $D_n$ as in the above-described embodiment.

The signal selection unit 500 may include as many multiplexers MUX1 and MUX2, . . . , and MUXj as the number of the groups. A calibration unit 100 may output a multiplexer control signal (not shown) to perform a control such that signals input to the multiplexers MUX1, MUX2, . . . , and MUXj are selected and output.

Figure 15A:
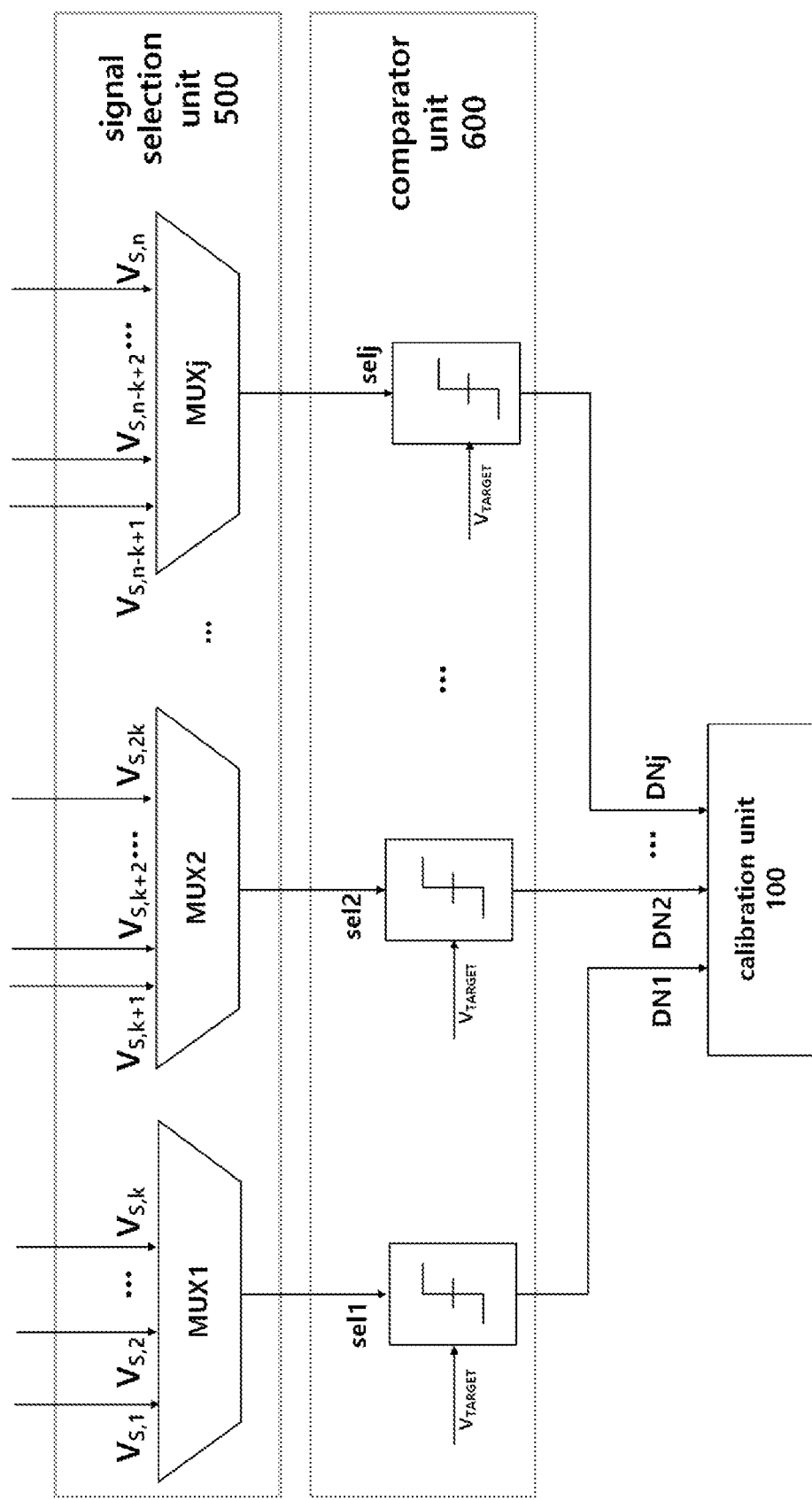
FIGS. 15A-15C show schematic diagrams illustrating a signal selection unit and a comparator unit of FIG. 14.

In the embodiment illustrated in FIG. 15A, load voltages $V_{S,1}, V_{S,2}, \ldots,$ and $V_{S,k}$ after charge sharing, which are output by the data line drivers $D_1, D_2, \ldots,$ and $D_k$ belonging to J groups in total, are supplied to the multiplexers MUX1, MUX2, . . . , and MUXj for every group to which the data line drivers $D_1, D_2, \ldots,$ and $D_k$ belong.

Each of the multiplexers MUX1, MUX2, . . . , and MUXj is controlled based on a control signal (not shown) supplied by the calibration unit 100 to output one load voltage after the charge sharing in response to the control signal (not shown) as a selection signal sel1, sel2, . . . , or selj.

According to an embodiment not shown, the multiplexers may output a plurality of selection signals, and the calibration unit may output a control signal such that the multiplexers output the plurality of selection signals.

The comparator unit 600 may include comparators 400 corresponding to the number of signals output by the multiplexers. As described above, a target voltage $V_{TARGET}$ output by the calibration unit 100 is input as one input of each comparator, and the selection signal sel1, sel2, . . . , or selj output by the multiplexer may be input as the other input thereof.

The comparator unit 600 compares a magnitude of the target voltage $V_{TARGET}$ supplied as one input with a magnitude of the selection signal sel1, sel2, . . . , or selj supplied as the other input and outputs a comparison result signal $DN_1$, $DN_2$, . . . , or $DN_j$ corresponding to a comparison result to the calibration unit 100.

As described above, the calibration unit 100 may perform calibration on the selected number of the data line drivers for each group and may sequentially perform calibration on the remaining data line drivers belonging to the groups. In an embodiment not shown, each of the multiplexers MUX1, MUX2, . . . , and MUXj included in the signal selection unit 500 may output two or more selection signals. The calibration unit 100 may control the signal selection unit 500 such that the multiplexers output two or more selection signals to the comparator unit 600. Accordingly, the calibration unit 100 may select two data line drivers for each group to perform calibration on a boost circuit included in each data line driver.

In an embodiment not shown, calibration may be sequentially performed for each group. As an example, the calibration unit 100 may perform calibration through a method of first completing calibration on boost circuits belonging to the data line drivers belonging to one group of the plurality of groups and then performing calibration on boost circuits belonging to another group.

Figure 15C:
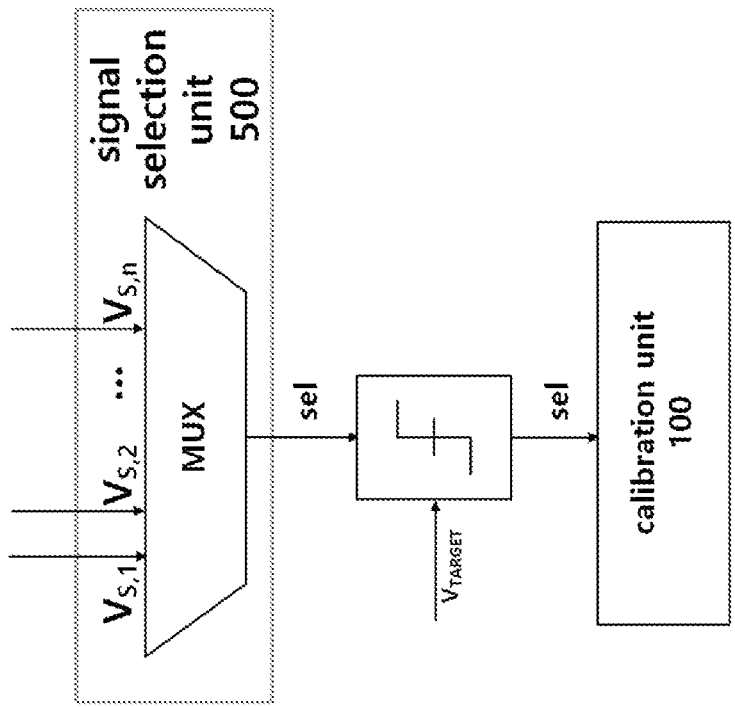
Figure 15B:
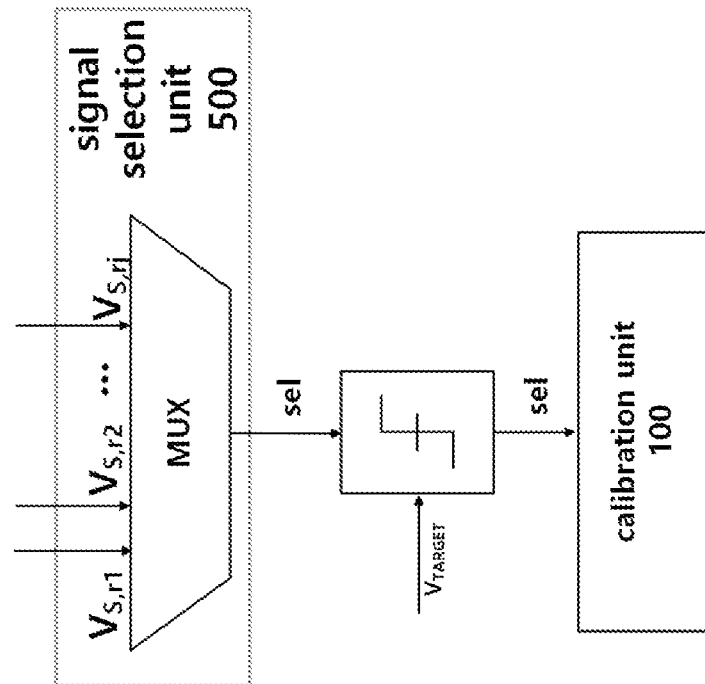

In the embodiment illustrated in FIG. 15B, one representative data line driver selected from among the plurality of data line drivers for each group supplies a load voltage $V_{S,r1}$, $V_{S,r2}$, . . . , or $V_{S,rj}$ after charge sharing to the signal selection unit 500. The calibration unit 100 outputs a control signal (not shown) such that one of the load voltages $V_{S,1}$, $V_{S,2}$, . . . , and $V_{S,k}$ after the charge sharing input to the multiplexers MUX included in the signal selection unit 500 is output as a selection signal sel.

The comparator unit 600 may compare a magnitude of the selection signal sel with a magnitude of the target voltage $V_{TARGET}$ and may supply a comparison result signal corresponding to a comparison result to the calibration unit 100 to perform a calibration process. After calibration on a boost circuit of the representative data line driver is completed, the calibration unit 100 may collectively calibrate boost circuits 300 included in the corresponding group using a calibration result.

In the embodiment illustrated in FIG. 15B, calibration may be performed on a corresponding group using one representative data line driver for each group, but according to another embodiment not shown, calibration may be performed on a corresponding group using two or more representative data line drivers for each group.

In the embodiment illustrated in FIG. 15C, the data line drivers $D_1$, $D_2$, . . . , and $D_n$ output load voltages $V_{S,1}$, $V_{S,2}$, . . . , and $V_{S,n}$, respectively, after charge sharing. The calibration unit 100 may control the signal selection unit 500 to sequentially perform calibration for the boost circuits included in the plurality of data line drivers $D_1$, $D_2$, . . . , and $D_n$. However, according to another embodiment not shown, the multiplexer MUX may perform boost circuit calibration by supplying comparison result signals supplied by two or more data line drivers to the calibration unit 100.

A method of calibrating a boost circuit described above may be performed when a display device is manufactured and then released and may be performed when the display device is powered off and restarted.

According to the present embodiment, there is provided an advantage in that a driving time of a boost circuit can be calibrated to drive a display device in response to a high frame rate of a large-area display.

While the embodiments shown in the drawings have been described as reference in order to help an understanding of the present invention, the above embodiments are merely illustrative for the purpose of implementation, and also it is to be understood by those skilled in the art that various modifications and equivalent embodiments may be made. Accordingly, the scope of the present invention should be defined by the accompanying claims.

What is claimed is:

1. A method of calibrating a boost circuit, the method comprising:
    (a) resetting a load to a reference voltage;
    (b) supplying a charging voltage to the load through a boost circuit for a driving time such that charge sharing is performed in the load;
    (c) comparing a voltage of the load after the charge sharing with a target voltage; and
    (d) adjusting a duration of the driving time according to a result of the step (c),
    wherein the step (b) is performed by supplying a driving time control code to the boost circuit and supplying, by the boost circuit, the charging voltage to the load for a driving time corresponding to the driving time control code, and
    the step (d) is performed by correcting the driving time control code according to a result of step (c).

2. The method of claim 1, wherein the boost circuit includes:
    a first boost switch that is turned on to supply a first driving voltage to the load as the charging voltage; and
    a second boost switch that is turned on to supply a second driving voltage lower than the first driving voltage to the load as the charging voltage.

3. The method of claim 2, wherein, when the target voltage is higher than the voltage of the load after the charge sharing, a calibration unit performs at least one of increasing a driving time of the first boost switch and decreasing a driving time of the second boost switch.

4. The method of claim 2, wherein, when the target voltage is lower than the voltage of the load after the charge sharing, a calibration unit performs at least one of decreasing a driving time of the first boost switch and increasing a driving time of the second boost switch.

5. The method of claim 1, wherein the step (b) includes:
    a first step (b1) of supplying the charging voltage to the load through the boost circuit; and
    a second step (b2) of performing the charge sharing in the load.

6. The method of claim 1, wherein the step (c) is performed using an operational amplifier included in a source driver.

7. The method of claim 1, wherein the step (c) is performed using a comparator.

8. The method of claim 1, wherein the method is performed on all data lines output from a source driver.

9. The method of claim 1, wherein the method is performed on a number of data lines selected from among a plurality of data lines output from a source driver.

10. The method of claim 1, wherein the method is performed at least at any one of a time when a display device including a source driver is released from a factory or a time when the display device is driven.

11. The method of claim 1, wherein the method is performed as many times as the number of bits of the driving time control code.

12. The method of claim 1, wherein the method is performed until a difference between the voltage of the load after the charge sharing and the target voltage falls within a predetermined error range.

* * * * *